United States Patent
May et al.

(10) Patent No.: US 11,728,779 B2
(45) Date of Patent: Aug. 15, 2023

(54) SIGNAL TRACKING-BASED SUPPLY VOLTAGE GENERATION WITH OVER-BOOSTED VOLTAGE

(71) Applicant: Cirrus Logic International Semiconductor Ltd., Edinburgh (GB)

(72) Inventors: Jeffrey A. May, Dripping Springs, TX (US); Eric J. King, Austin, TX (US); Christian Larsen, Austin, TX (US); Eric Eklund, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 266 days.

(21) Appl. No.: 16/745,511

(22) Filed: Jan. 17, 2020

(65) Prior Publication Data

US 2020/0235712 A1    Jul. 23, 2020

Related U.S. Application Data

(60) Provisional application No. 62/793,983, filed on Jan. 18, 2019.

(51) Int. Cl.
| | |
|---|---|
| *H03F 3/04* | (2006.01) |
| *H03G 3/00* | (2006.01) |
| *H02M 3/04* | (2006.01) |
| *H03F 3/20* | (2006.01) |
| *H03G 3/30* | (2006.01) |
| *H04R 3/00* | (2006.01) |

(52) U.S. Cl.
CPC ............. *H03G 3/007* (2013.01); *H02M 3/04* (2013.01); *H03F 3/20* (2013.01); *H03G 3/004* (2013.01); *H03G 3/3005* (2013.01); *H03F 2200/03* (2013.01); *H04R 3/00* (2013.01)

(58) Field of Classification Search
CPC .......... B01L 3/502715; B01L 2200/16; B01L 2300/0819; B01L 2300/12; B01L 2300/0681; B01L 2200/0652; B01L 2200/12; B01L 2300/0887; B01L 2300/0816; B01L 3/502761; G01N 1/30; H03F 3/04; H03F 1/0244; H03F 1/0211; H03F 2200/504; H03F 1/0227; H03G 3/3042; H03G 3/004
USPC ......................................... 330/127, 297, 136
See application file for complete search history.

(56) References Cited

U.S. PATENT DOCUMENTS

| | | | |
|---|---|---|---|
| 9,520,782 B2 * | 12/2016 | Pazhayaveetil | ........ H03G 3/004 |
| 10,021,485 B2 | 7/2018 | May et al. | |
| 10,243,524 B2 * | 3/2019 | Orr ..................... | H02M 3/1582 |
| 10,749,431 B2 * | 8/2020 | Pazhayaveetil ....... | H03F 1/0227 |
| 10,958,171 B2 * | 3/2021 | Vadnerkar ............. | H02M 3/157 |
| 2018/0351478 A1 * | 12/2018 | King .................... | H02N 2/0075 |

(Continued)

*Primary Examiner* — Khanh V Nguyen
(74) *Attorney, Agent, or Firm* — Jackson Walker L.L.P

(57) ABSTRACT

A power converter may include an input for receiving an input signal and output for generating an intermediate signal that is a power converted signal from the input signal wherein the intermediate signal is determined based on various parameters of a signal path that utilizes the intermediate signal, wherein the various parameters comprise one or more of the following: a peak output signal of the signal path, energy requested over a period of time by the signal path, available energy from an energy source to the power converter, stored energy at an output of the power converter, and stored energy of a battery for providing electrical energy at the input.

28 Claims, 11 Drawing Sheets

(56) References Cited

U.S. PATENT DOCUMENTS

2019/0013735 A1  1/2019  King et al.
2019/0089245 A1  3/2019  King et al.

* cited by examiner

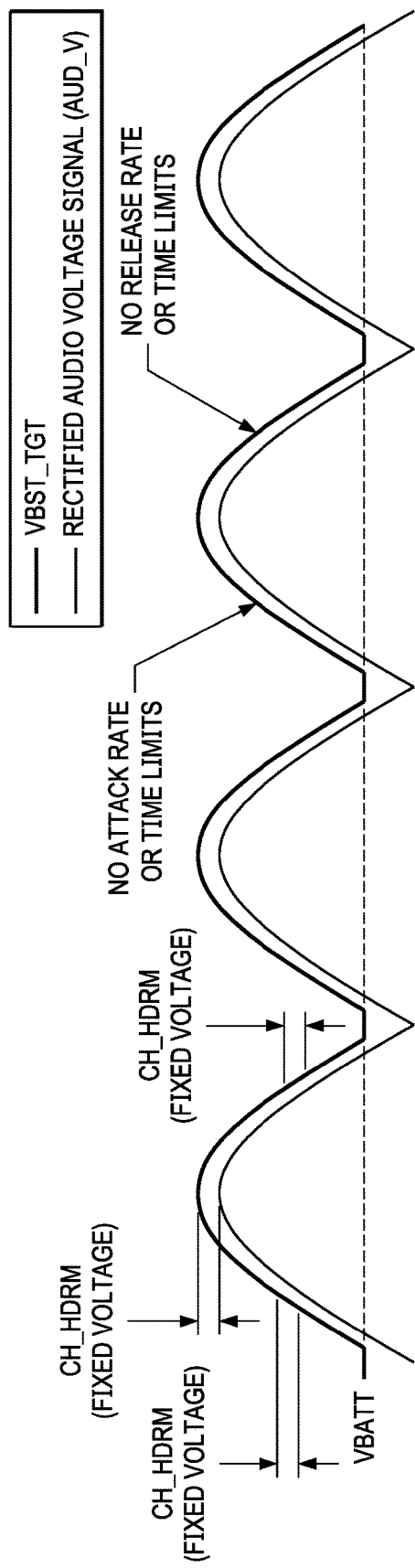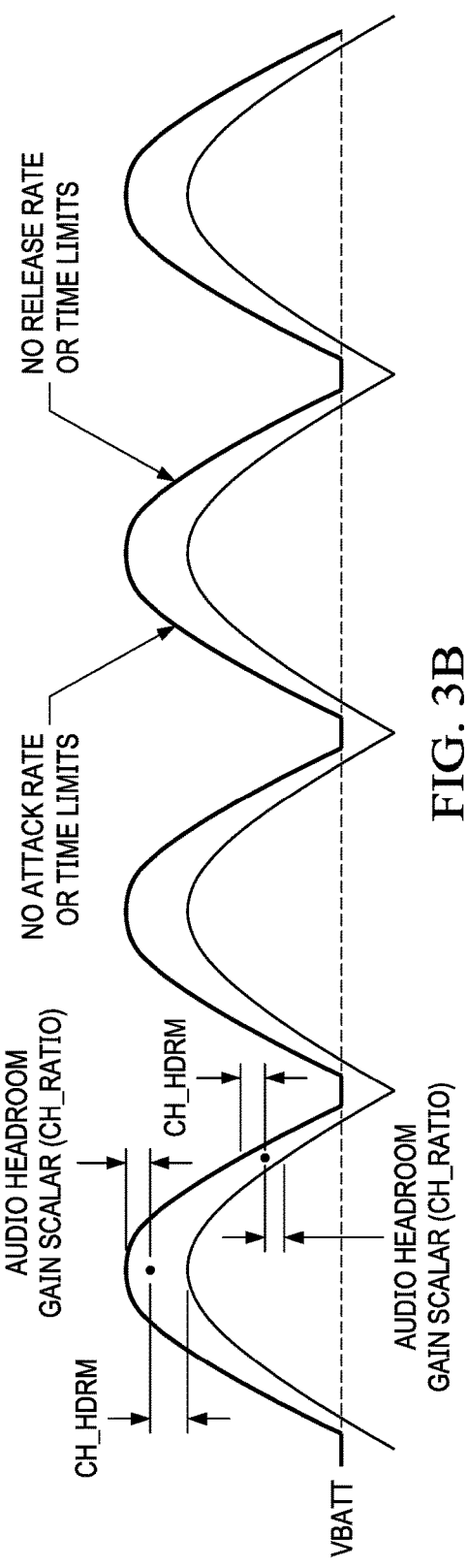
FIG. 3A
FIG. 3B

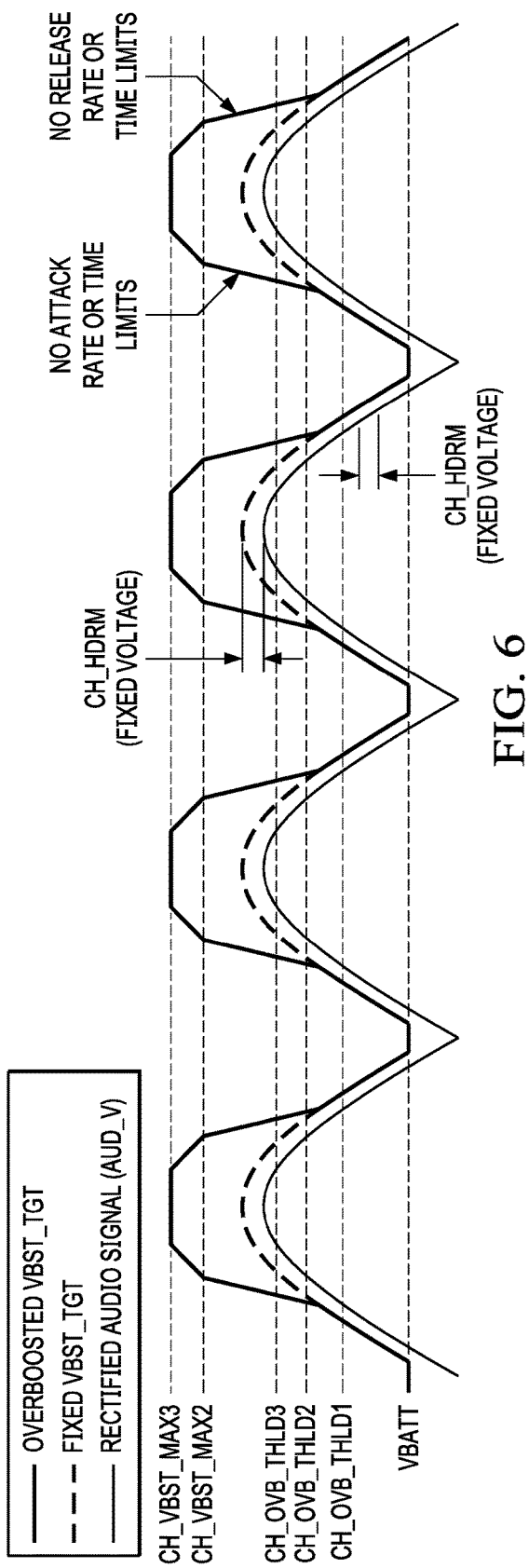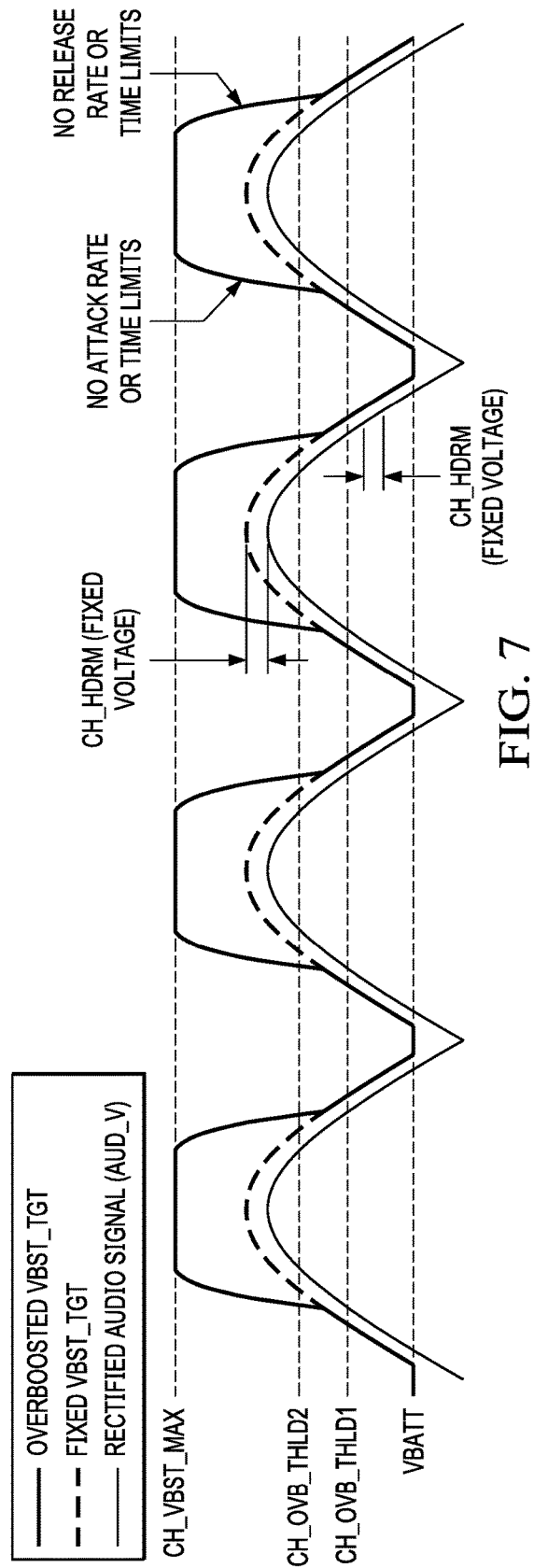
FIG. 6
FIG. 7

SIGNAL TRACKING-BASED SUPPLY VOLTAGE GENERATION WITH OVER-BOOSTED VOLTAGE

RELATED APPLICATIONS

The present disclosure claims priority to U.S. Provisional Patent Application Ser. No. 62/793,983, filed Jan. 18, 2019, which is incorporated by reference herein in its entirety.

FIELD OF DISCLOSURE

The present disclosure relates in general to circuits for audio devices, including without limitation personal audio devices such as wireless telephones and media players, and more specifically, to prevention of clipping of an audio signal due to a decrease in amplifier supply voltage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

In many devices, a boost converter may serve as a power supply to supply a power amplifier with electrical energy for the power amplifier's output stage. As known in the art, a boost converter is a power converter that converts a direct-current voltage, often a voltage output by a battery, to a larger direct-current voltage. Typically, substantially all of the current delivered by the power amplifier to the load (e.g., headphone or speaker) is supplied by the boost converter.

Many static and dynamic methods exist for limiting a boost converter's power consumption of a battery in order to protect a device from consuming too much power or causing a drop in the battery supply voltage down to a level susceptible to browning out a device. However, if the boost converter limits its power supply consumption from a battery-supplied source voltage in order to protect the battery, the boosted supply voltage is likely to lose regulation under heavy loading conditions, thereby creating a reduced supply voltage. Due to the reduced supply voltage, the amplifier's output stage can either be clipped, or the audio signal can be reduced in order to prevent the clipping. Such clipping or reduction of the output signal is not desired.

Normally, signal tracking algorithms, such as Class H or Class G algorithms, may monitor an input signal in order to create a target boosted supply voltage which is large enough not to clip the amplifier's output signal, but not too large as to create system level efficiency losses. If only the output referred signal amplitude of the amplifier is being tracked to generate a target voltage, there may exist limited charge storage in a boost capacitor of the boost converter capacitor, and when the boost converter reaches its input current limit, the boost converter may lose its ability to properly regulate the boosted supply voltage, the boosted supply voltage may collapse, and the amplifier's output may be clipped (or may require signal reduction prior to clipping). In order to not significantly impact system level efficiency, an over-boosted behavior may need to take into account more than just the output referred signal amplitude of the amplifier.

Monitoring a signal to be amplified by the boosted amplifier and state of the boost converter's input current relative to the input current limit of the boost converter may allow identification of when the boost converter is running out of available power to deliver to the amplifier. When the boost converter approaches, but has not yet reached the point where it is running out of its limited available input power, the over-boost functionality of a signal tracking algorithm may take over and intentionally generate a higher target voltage than is required by the audio signal alone. This higher target voltage generation may place the capacitor into a temporary state in which its additional stored energy from the overboosted voltage may be discharged and provided to the amplifier if and/or when the boost converter's input current or power consumption is limited.

A prior art example of signal tracking with a boost converter is disclosed in U.S. Pat. No. 9,520,782 entitled "Boost Converter Voltage Controlled based on Audio Signal."

A prior art example of utilizing stored energy in a storage capacitor and then disconnecting the storage capacitor from the system to perform Class H switching is disclosed in U.S. Ser. No. 15/783,744 filed on Oct. 13, 2017, and entitled "Boost Converter with Energy Storage" (Inventors: Eric King, Eric B. Smith, Mark May).

A prior art example of a boost converter that applies current limit is disclosed in U.S. Ser. No. 16/122,619 filed on Sep. 5, 2018, and entitled "Limiting average current in a peak-controlled boost converter" (Inventors: Eric King, Eric B. Smith).

A prior art example of directly reducing the output signal when the boosted supply voltage collapses is disclosed in U.S. Pat. No. 10,021,485 entitled "Prevention of Signal Clipping Due to Decrease in Amplifier Supply Voltage."

SUMMARY

In accordance with the teachings of the present disclosure, one or more disadvantages and problems associated with existing approaches to supplying electrical energy to a signal tracking-based, over-boosted amplifier supply voltage may be reduced or eliminated.

In accordance with embodiments of the present disclosure, a power converter may include an input for receiving an input signal and output for generating an intermediate signal that is a power converted signal from the input signal wherein the intermediate signal is determined based on various parameters of a signal path that utilizes the intermediate signal, wherein the various parameters comprise one or more of the following: a peak output signal of the signal path, energy requested over a period of time by the signal path, available energy from an energy source to the power converter, stored energy at an output of the power converter, and stored energy of a battery for providing electrical energy at the input.

In accordance with these and other embodiments of the present disclosure, a power converter may include an input for receiving an input signal and output for generating an intermediate signal that is a power converted signal from the input signal wherein the intermediate signal varies with respect to an amount of stored energy required by an output of a signal path and available energy from a power supply for providing electrical energy at the input.

In accordance with these and other embodiments of the present disclosure, a system may include an amplifier configured to amplify an input signal to generate an output signal at an output of the amplifier and a power converter coupled to the amplifier and configured to provide a supply voltage to the amplifier, wherein the power converter is further configured to vary an amount of excess energy stored at an output of the power converter.

In accordance with these and other embodiments of the present disclosure, a method may include receiving an input signal and generating with a power converter an intermediate signal that is a power converted signal from the input signal wherein the intermediate signal is determined based on various parameters of a signal path that utilizes the intermediate signal, wherein the various parameters comprise one or more of the following: a peak output signal of the signal path, energy requested over a period of time by the signal path, available energy from an energy source to the power converter, stored energy at an output of the power converter, and stored energy of a battery for providing electrical energy at the input.

In accordance with these and other embodiments of the present disclosure, a method may include receiving an input signal and generating with a power converter an intermediate signal that is a power converted signal from the input signal wherein the intermediate signal varies with respect to an amount of stored energy required by an output of a signal path and available energy from a power supply for providing electrical energy at the input.

In accordance with these and other embodiments of the present disclosure, a method may include amplifying an input signal with an amplifier to generate an output signal at an output of the amplifier, providing, with a power converter coupled to the amplifier, a supply voltage to the amplifier, and varying with the power converter an amount of excess energy stored at an output of the power converter.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3A illustrates a graph depicting an example of a Class H headroom controller generating a target boost voltage with fixed voltage headroom CH_HDRM relative to rectified output referred signal AUD_V, in accordance with embodiments of the present disclosure;

FIG. 3B illustrates a graph depicting an example of a Class H headroom controller generating a target boost voltage with a combination fixed voltage headroom CH_HDRM relative to rectified output referred signal AUD_V and ratiometric headroom voltage CH_RATIO that scales with the ratio of a rectified output referred signal AUD_V, in accordance with embodiments of the present disclosure;

FIG. 6 illustrates a graph depicting an example of a Class H headroom controller generating an over-boosted target boost voltage with a linear response using three thresholds and a fixed voltage headroom, in accordance with embodiments of the present disclosure;

FIG. 7 illustrates a graph depicting an example of a Class H headroom controller generating an over-boosted target boost voltage with a non-linear response using two thresholds and a fixed voltage headroom, in accordance with embodiments of the present disclosure;

DETAILED DESCRIPTION

Figures 1A, 1B:
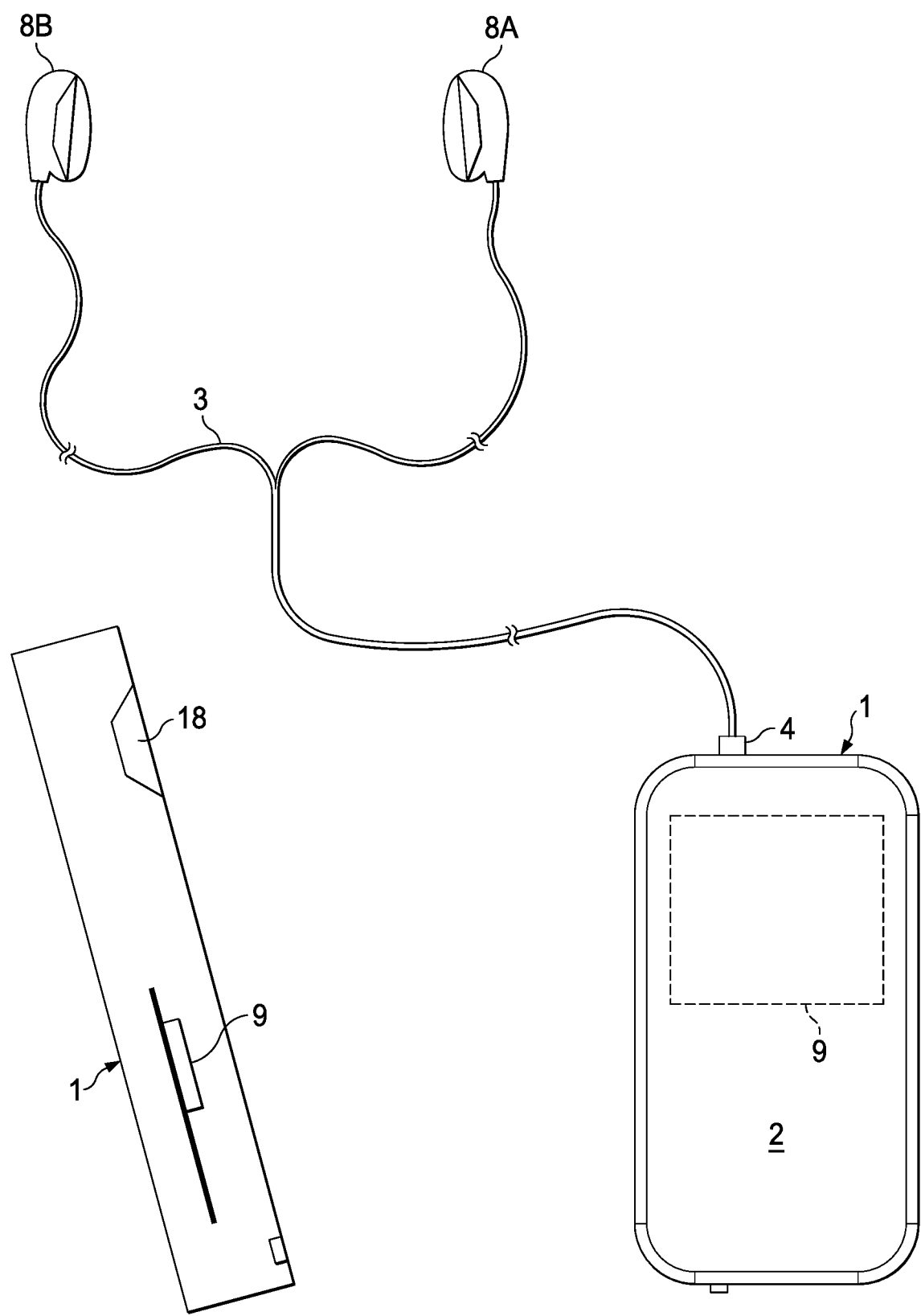
FIG. 1A is an illustration of an example personal audio device, in accordance with embodiments of the present disclosure.
FIG. 1B is an illustration of another example personal audio device, in accordance with embodiments of the present disclosure.

FIG. 1A is an illustration of an example personal audio device 1, in accordance with embodiments of the present disclosure. FIG. 1A depicts personal audio device 1 coupled to a headset 3 in the form of a pair of earbud speakers 8A and 8B. Headset 3 depicted in FIG. 1A is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1A, personal audio device 1 may include an audio integrated circuit (IC) 9 for generating an analog audio signal for transmission to headset 3 and/or another audio transducer.

FIG. 1B is an illustration of another example personal audio device 1, in accordance with embodiments of the present disclosure. FIG. 1B depicts personal audio device 1 having an integrated speaker 18. Speaker 18 depicted in FIG. 1B is merely an example, and it is understood that personal audio device 1 may be used in connection with a variety of audio transducers, including without limitation, headphones, earbuds, in-ear earphones, and external speakers. As also shown in FIG. 1B, personal audio device 1 may include an audio integrated circuit (IC) 9 for generating an analog audio signal for transmission to headset 3 and/or another audio transducer.

Figure 2:
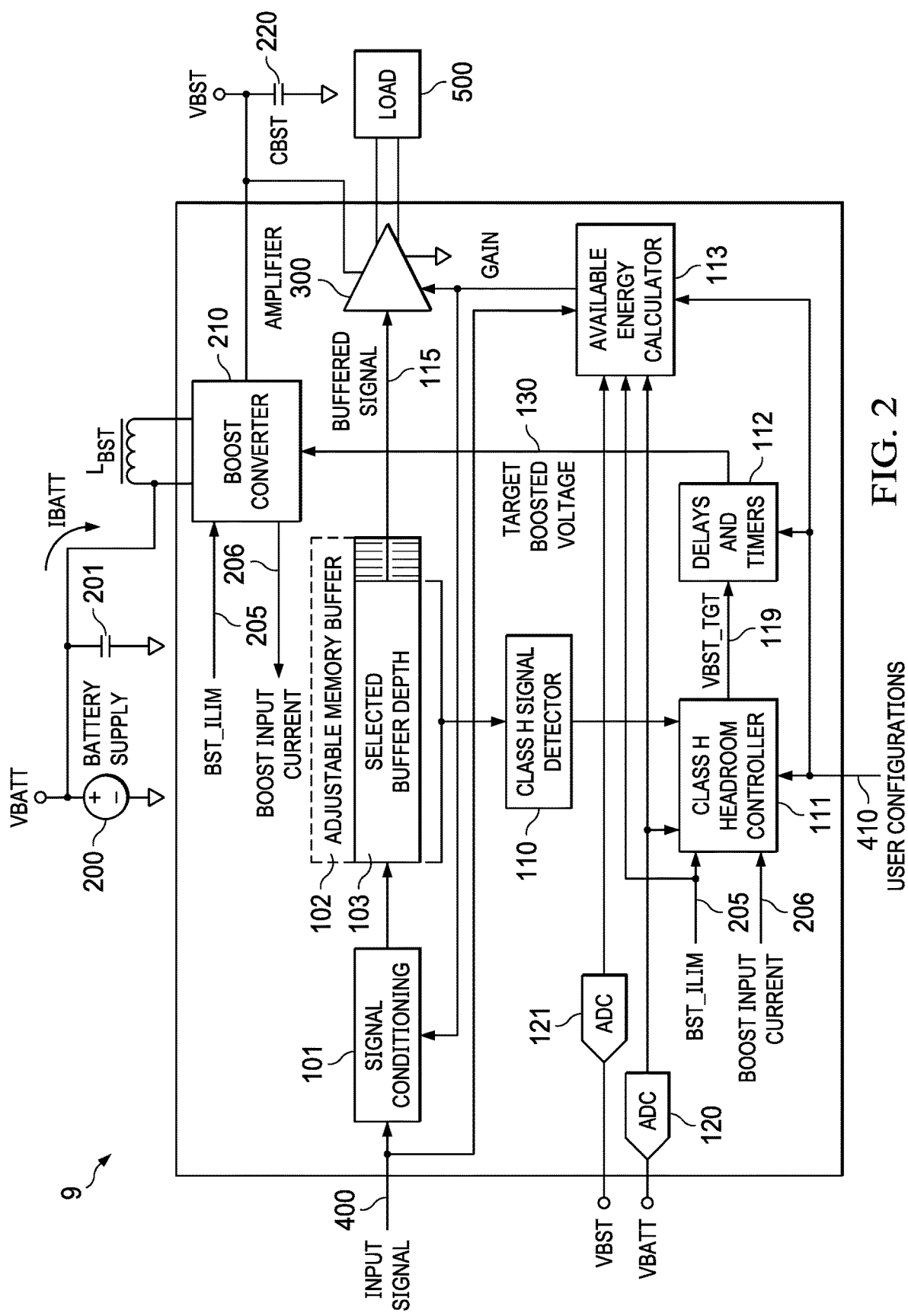
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a boosted supply voltage VBST may be generated by a boost converter 210. Boost converter 210 may receive its input supply power from a battery supply 200 that supplies a battery voltage VBATT and a battery current IBATT to an input of boost converter 210. Boost converter 210 may have an input current limit BST_ILIM 205 which sets a maximum amount of battery current IBATT that boost converter 210 is permitted to consume from battery supply 200. Boost converter 210 may output a boost input current signal 206 which may be representative of the battery current IBATT and/or may be representative of whether an input current threshold representative of battery current IBATT has been reached. Both input current limit BST_ILIM 205 and boost input current 206 may be provided to a Class H headroom controller 111 along with user configurations 410 and buffered audio signal information captured by a Class H signal detector 110 in order to determine when it may be necessary to generate an over-boosted boosted supply voltage VBST and the magnitude of such over-boosted voltage.

Boost converter 210 may have an energy storage element 220 at its output (e.g., a capacitor having capacitance CBST). As should be recognized by one of skill in the art, charge storage of energy storage element 220 may increase as a squared function based on a voltage supplied to the capacitor ($E = \frac{1}{2} * CBST * VBST^2$, where E represents energy). If boosted supply voltage VBST output by boost converter 210 and energy storage element 220 are at a higher voltage level than the amplifier's maximum voltage output, then some of the extra available energy stored in capacitor 220 and resulting from the "over-boosted" supply voltage VBST may be used to supply an amplifier 300 when the input of boost converter 210 is power limited. This use of extra energy does not necessarily prevent boosted supply voltage VBST supplied by boost converter 210 from collapsing or drooping, but may delay the voltage collapse so that an amplifier-loading transient has a greater opportunity to pass through without clipping the output signal of amplifier 300 or manipulating a signal of amplifier 300 (e.g., via another sub-system) to prevent clipping due to drooping boosted supply voltage VBST.

Class H headroom controller 111 may generate and control a target boost voltage VBST_TGT of boost converter 210 so as to over boost boosted supply voltage VBST to temporarily store excess energy when boost converter 210 is operating close to or approaching (but has not yet reached) input current limit BST_ILIM 205 in order for energy storage element 220 to act as an additional, but temporary energy storage for the boosted amplifier system depicted in FIG. 2.

An input signal 400 may comprise an audio signal or non-audio signal (e.g., output voltage target, haptic signal, output current drive target, etc.) intended to be reproduced by amplifier 300. For purposes of delineating between other signals, the term "input signal," may refer to the signal path from input signal 400, through amplifier 300, to load 500. During the process of propagating to amplifier 300, the input signal may be modified by other subsystems such as a signal conditioning block 101.

User configurations 410 depicted in FIG. 2 may be considered modifications to the Class H functionality which may be initiated inside audio IC 9 or outside audio IC 9 (e.g., a control port register). Examples of these user configurations may be thresholds of how much signal headroom margin is required prior to over-boosting, the shaping of the over-boost voltage profile when active, whether and how the over-boost thresholds track a dynamic input current limit BST_ILIM 205, the shaping of Class H headroom tracking when not over-boosting, the configuration of any tracking or overboost release delays or timers which limit the bandwidth of the tracking, and/or adaptations on how a target boosted voltage 130 may be modified based on monitored battery voltage VBATT via an analog-to-digital converter (ADC) 120. Examples of possible user configurations are further described below with respect to Class H headroom controller 111.

A signal conditioning block 101 may include any system, device, or apparatus that may manipulate the input signal 400 prior to reaching the input of amplifier 300. Such audio signal manipulation may include, but is not limited to filtering, volume control, interpolation, decimation, digital signal processor (DSP) processing, equalization (EQ) responses, magnitude compensation, phase compensation, etc. Thus, signal conditioning block 101 may provide processed signal information to amplifier 300, which may be important in determining how to properly generate target boosted voltage 130 for the amplifier 300 with over-boost functionality.

Audio IC 9 may further include an adjustable memory buffer 102 to buffer the streaming audio data between the output of signal conditioning block 101 and the input of amplifier 300. This buffering may allow Class H signal detector 110 to identify an amplitude and/or envelope of input signal 400 or envelope in order to determine how large of an output signal amplifier 300 may generate to and allow for preconfiguration of the boosted supply voltage VBST in order to accommodate supply voltage requirements of amplifier 300.

Selected buffer depth 103 of adjustable memory buffer 102 may allow for dynamic modification (e.g., by a user or by audio IC 9 itself) of a depth of adjustable memory buffer 102 to provide desired signal delay for Class H signal detector 110 as well as a desired signal path delay between input signal 400 and a buffered audio signal 115 provided to the input of amplifier 300. Selected buffer depth 103 may be as small as a single audio sample (i.e., no delay) or as large as practically available in either a hardware or software created data buffer.

In signal-tracking boosted amplifier systems, there may be tradeoffs and benefits of having a small selected buffer depth 103 and a longer selected buffer depth 103. A longer selected buffer depth 103 may provide more look-ahead for Class H signal detector 110 and allow for smaller change slopes for target boosted voltage 130, which may help with inrush current limiting of boost converter 210. With this extended look-ahead, the effective bandwidth of the Class H amplifier system implemented by audio IC 9 may be reduced, which may negatively impact system efficiency. Also, in actual implementation, there may exist practical limitations on how long a look-ahead buffer may be made. Extending the adjustable memory buffer 102 may require delaying buffered audio signal 115 to amplifier 300. Extending selected buffer depth 103 to a large degree may produce undesirable system-level impacts to the final product or the end user (e.g., the end user pushing a button to playback music and waiting an extended period of time before any response occurs due to the extended adjustable memory buffer 102).

Class H signal detector 110 may monitor the data in the adjustable memory buffer 102 and may convert such data from a buffered input audio signal to a signal representative of what the output signal amplifier 300 would be expected to produce if buffered audio signal 115 were delivered to load 500 without the modifications to signal path parameters described herein.

Class H headroom controller 111 may generate a target boost voltage VBST_TGT 119 based on the detected signal provided by Class H signal detector 110. Class H headroom controller 111 may be responsible for: applying a fixed offset, or signal-level gained offset to target boost voltage VBST_TGT 119, determining when to start generating target boost voltage VBST_TGT 119, and determining when over-boost of boosted supply voltage VBST needs to be at its maximum level.

Hereinafter in the present disclosure, the following definitions specific to Class H headroom controller 111 and the various headroom control examples may be used:

Target boost voltage VBST_TGT 119 may be the target voltage for boosted supply voltage VBST and may be generated by Class H headroom controller 111. Target boost voltage VBST_TGT 119 may not be the final target voltage to boost converter 210 (target boosted voltage 130), but rather an intermediate value provided to a delays and timers block 112.

Signal AUD_V may be the rectified output referred (calculated) signal of amplifier 300.

Headroom voltage CH_HDRM may be a fixed voltage headroom which is applied to target boost voltage VBST_TGT 119. It may be used in isolation or in conjunction with ratiometric headroom voltage CH_RATIO and/or over-boost functionality.

Ratiometric headroom voltage CH_RATIO may be a ratiometric voltage headroom (relative to rectified output referred signal AUD_V) which may be applied to target boost voltage VBST_TGT 119. It may be used in isolation or conjunction with fixed headroom voltage CH_HDRM and/or over-boost functionality.

Threshold CH_OVB_THLD1 may be a threshold in which Class H headroom controller 111 stops controlling target boost voltage VBST_TGT 119 based on fixed headroom voltage CH_HDRM and/or ratiometric headroom voltage CH_RATIO, and begins controlling target boost voltage VBST_TGT 119 based on over-boost functionality for an increasing rectified output referred signal AUD_V. For a decreasing rectified output referred signal AUD_V, threshold CH_OVB_THLD1 may be a threshold at which over-boosting has ceased and target boost voltage VBST_TGT 119 is controlled via fixed headroom voltage CH_HDRM and/or ratiometric headroom voltage CH_RATIO again.

Threshold CH_OVB_THLD2 may be a threshold in which target boost voltage VBST_TGT 119 has reached a maximum boosted voltage CH_VBST_MAX for an increasing rectified output referred signal AUD_V as a part of over-boosting. For a decreasing rectified output referred signal AUD_V, threshold CH_OVB_THLD2 may be the threshold at which the over-boosted supply voltage VBST begins to decrease from the maximum boosted voltage CH_VBST_MAX.

Maximum boosted voltage CH_VBST_MAX may be a maximum possible boosted voltage VBST which may be requested by Class H headroom controller 111 and/or generated by boost converter 210.

Additional thresholds or signal controls not listed above may also be applied. The various thresholds and/or tracking domains may either be based on voltage or current. These voltages or currents may include, but are not limited to a signal voltage of amplifier 300, a signal current of amplifier 300, measured or calculated battery current IBATT, user configurable thresholds, and/or any other parameters.

Target boost voltage VBST_TGT 119 may be limited to battery voltage VBATT. A target boost voltage VBST_TGT 119 lower than the battery voltage VBATT may not request a boosted voltage, and target boost voltage VBST_TGT 119 may remain battery voltage VBATT for purposes of having boost converter 210 in a bypass mode.

The various examples below for calculating target boost voltage VBST_TGT 119 may not take into account the effects of delays and timers block 112 which may slow down or add delay to the attack and/or releasing target boosted voltage 130 provided to boost converter block 210 for generation of boosted supply voltage VBST. These examples below may also not take into account an actual response of boost converter 210, which may vary based on architecture, loop bandwidth, regulation capabilities, etc.

As shown in FIG. 2, audio IC 9 may also include an available energy calculator 113. Available energy calculator 113 may receive battery voltage VBATT (as digitized by ADC 120), boosted supply voltage VBST (as digitized by ADC 121) input current limit BST_ILIM 205, input signal 400, and user configurations 410, and based thereon, determine a total amount of available electrical energy available from battery supply 200 and stored on energy storage device 220. Further, available energy calculator 113 may be configured to determine whether the total available electrical energy is sufficient to avoid clipping of the signal output by amplifier 300 and responsive to a determination that the total available electrical energy is insufficient to avoid clipping of the signal output by amplifier 300, modify (e.g., decrease) a gain applied by signal conditioning block 101 and/or amplifier 300 in order to avoid clipping.

FIG. 3A illustrates a graph depicting an example of Class H headroom controller 111 generating fixed voltage headroom CH_HDRM relative to rectified output referred signal AUD_V (e.g., VBST_TGT 119=AUD_V+CH_HDRM), in accordance with embodiments of the present disclosure. Similarly, FIG. 3B illustrates a graph depicting an example of Class H headroom controller 111 generating a combination fixed voltage headroom CH_HDRM relative to rectified output referred signal AUD_V and ratiometric headroom voltage CH_RATIO that scales with the ratio of rectified output referred signal AUD_V to provide more headroom at larger signals (e.g., VBST_TGT 119=AUD_V+ CH_HDRM+(AUD_V*CH_RATIO)), in accordance with embodiments of the present disclosure. Because many amplifiers may have a maximum modulation index, not a fixed overhead voltage, allowing the Class H supply voltage (boosted supply voltage VBST) to scale with the signal allows the voltage overhead to be minimized at lower amplitudes without compromising performance at higher amplitudes. Conversely, if the headroom is tuned for a large amplitude performance, the headroom is larger than necessary at lower amplitudes and efficiency may be impacted.

In the case where an over-boost operation is supported by the Class H headroom controller 111, Class H tracking may be divided into two basic ranges of operation: non-over-boosted operation and over-boosted operation. The non-over-boosted operation may behave just as traditional Class H tracking would be expected to behave (e.g., as shown in FIGS. 3A and 3B). The over-boosted operation may occur when rectified output referred signal AUD_V has exceeded threshold CH_OVB_THLD1 (or another threshold which indicates that the system implemented by audio IC 9 should be generating an over-boosted voltage for purposes of temporary energy storage). Thus, non-over-boosted operation may occur for the condition AUD_V<CH_OVB_THLD1, while over-boosted operation may occur for the condition AUD_V>CH_OVB_THLD1.

Figure 4:
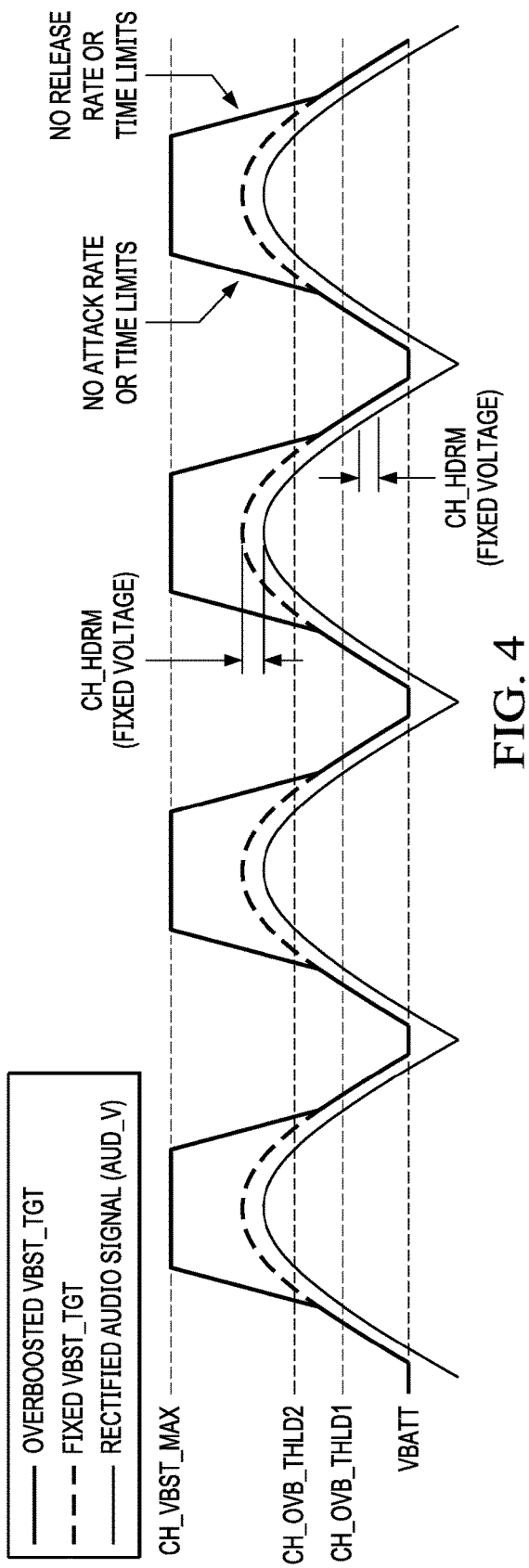
FIG. 4 illustrates a graph depicting an example of a Class H headroom controller generating an over-boosted target boost voltage with a linear response using two thresholds and a fixed voltage headroom, in accordance with embodiments of the present disclosure.

In one example of over-boosted operation, Class H headroom controller 111 may generate target boost voltage VBST_TGT 119 with a linear response in accordance with two thresholds (e.g., threshold CH_OVB_THLD1 and threshold CH_OVB_THLD2), as shown in FIG. 4, which may be given by:

$$VBST\_TGT\ 119 = AUD\_V + CH\_HDRM + (AUD\_V * CH\_RATIO) + ((AUD\_V - CH\_OVB\_THLD1) * (CH\_VBST\_MAX - CH\_OVB\_THLD2 - CH\_HDRM - (AUD\_V * CH\_RATIO))) / (CH\_OVB\_THLD2 - CH\_OVB\_THLD1)$$

Threshold CH_OVB_THLD1 may be the point at which the over-boost begins for an increasing rectified output referred signal AUD_V and ends for a decreasing rectified output referred signal AUD_V. Additional thresholds may be added in order to produce a piecewise linear or arbitrary function of over-boosting. Further, in the example shown in FIG. 4, when decreasing rectified output referred signal AUD_V has exceeded threshold CH_OVB_THLD2, target boost voltage VBST_TGT 119 may be at its maximum voltage as configured by maximum boosted voltage CH_VBST_MAX or limited by boost converter 210 itself. This limit may be required to protect against potential damage to the audio IC 9 or external supporting components which have voltage ratings which must be adhered to for reliable operation.

Figure 5:
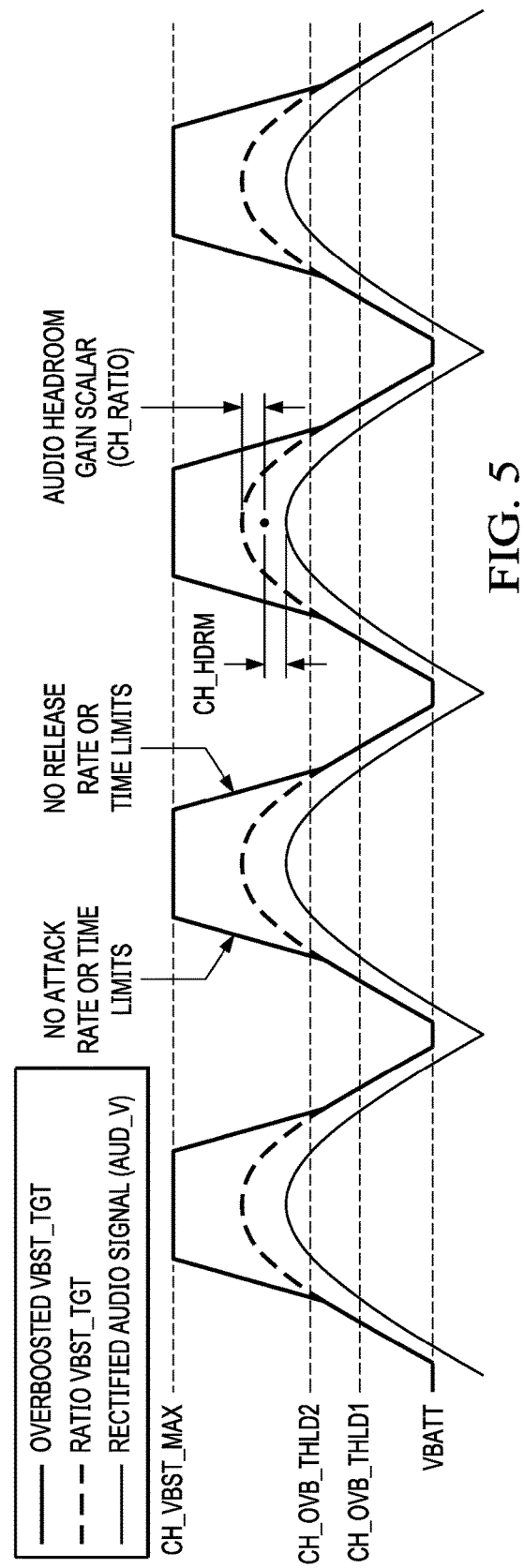
FIG. 5 illustrates a graph depicting an example of a Class H headroom controller generating an over-boosted target boost voltage with a linear response using two thresholds and a ratiometric voltage headroom, in accordance with embodiments of the present disclosure.

Comparing FIG. 4 (depicting a fixed headroom example) and FIG. 5 (depicting a ratiometric headroom example) illustrates how over-boost functionality may operate independently from the configuration of a non-over-boosted Class H operation, as the primary purpose of the over-boost may be to enable the system to create temporary energy storage when the boost converter is approaching its input current limit BST_ILIM 205.

Extensions of an overboost with a linear response may include Class H headroom controller 111 shaping the response through a series of additional thresholds and limits. For example, FIG. 6 provides an example of how a third threshold CH_OVB_THLD3 may be configured to operate based on the signal magnitude of input signal 400. The example of FIG. 6 may include an additional maximum threshold to set the slope or may include predefined slopes, wherein a higher-level threshold (e.g., threshold CH_OVB_THLD2 vs. threshold CH_OVB_THLD1) takes control of over-boost behavior once such threshold has been triggered and disengages once such threshold is no longer exceeded.

FIG. 7 depicts an illustration of how a non-linear over-boost may be pre-shaped in order to take advantage of non-linear energy storage of energy storage element 220 and/or to meet a pre-defined input current limit charging requirement. Depending on the system, the exact over-boost profile relative to rectified output referred signal AUD_V or its input current limit BST_ILIM 205 may vary, but with the same purpose of providing additional energy storage when boost converter 210 is at risk of being power limited due to its input current limit BST_ILIM 205.

In addition, or alternatively, it may be desirable to configure the over-boost profile based on the available input current headroom (available current headroom of battery current IBATT below input current limit BST_ILIM 205) or the available input power that boost converter 210 has to provide to the over-boost function itself. Just as discharging energy storage element 220 allows the boosted amplifier system implemented by audio IC 9 to temporarily leverage stored energy on energy storage element 220, this energy must first be put on energy storage element 220 by boost converter 210. Inclusive of any other loading present on boost converter 210, if the amount of available power to charge energy storage element 220 is insufficient, only a partial over-boost may be achieved. Under certain lesser loading conditions, this partial over-boost may still be sufficient, but with larger loading conditions, clipping may occur.

Leveraging a look-ahead or other predictive signal tracking functionality (e.g., mathematical derivative of rectified output referred signal AUD_V) and converting rectified output referred signal AUD_V signal to a representative load may provide the over-boosting functionality different options to determine when boost converter 210 will run out of energy and must have the energy storage element 220 fully pre-charged by the over-boost functionality for loading of amplifier 300 to take full advantage of the available energy. Boost converter 210 may require consuming additional input power to transfer to energy storage element 220. This additional input power consumption may often come at the same time that the output power requirements of boost converter 210 are increasing due to an increasing amplifier loading (e.g., rectified output referred signal AUD_V). Determining when these increasing output power demands of both load 500 and the charging of energy storage element 220 will converge with the input power limits through input current limit BST_ILIM 205 or another way may be necessary to ensure energy storage element 220 is fully precharged. This determination and over-boost profile generation may be generated through calculations or direct measurement of the loading on the output of boost converter 210 (e.g., monitored or calculated amplifier 300 power consumption, monitored or calculated amplifier 300 power delivery to load 500, efficiency calculations, monitored or calculated boost converter 210 output power delivery, etc.) and then converting this consumption over to an input current consumption or an input power consumption in order to determine how much power is available to provide to energy storage element 220 for purposes of setting the headroom calculations to generate an over-boost VBST voltage, with the goal to pre-charge energy storage element 220 to boost converter 210 running out of the ability to consume additional input power from battery supply 200.

In continuing with the example of a two-threshold over-boosted system (e.g., as shown in FIGS. 4 and 5), if input current limit BST_ILIM 205 dynamically changes, then the point at which the energy storage on energy storage element 220 may need to be fully charged and capable of being leveraged by the boosted amplifier system implemented by audio IC 9 may also change. In the case of a two-threshold system, this change means that threshold CH_OVB_THLD2 may need to dynamically track the changes in input current limit BST_ILIM 205, all the while taking into account the total system efficiency, battery voltage VBATT, and load 500 relative to rectified output referred signal AUD_V. In this case, threshold CH_OVB_THLD2 may be configured to track the amount of available input power, and depending on the system requirements, it may be desirable to either let threshold CH_OVB_THLD1 track changes in threshold CH_OVB_THLD2 or for threshold CH_OVB_THLD1 to remain fixed.

An over-boost profile which dynamically updates its thresholds (e.g., threshold CH_OVB_THLD1 and threshold CH_OVB_THLD2) in order to maintain a fixed over-boost slope may be advantageous in systems where leveraging charge storage from the energy storage element 220 is of greater importance than an overall efficiency of the system. In this case, input current limit BST_ILIM 205 may be experiencing aggressive changes by a subsystem trying to protect against a low voltage or a weak condition of battery supply 200. The additional energy available on energy storage element 220 may provide some additional buffer between a voltage collapse of boosted supply voltage VBST collapse induced by reaching input current limit BST_ILIM 205 and the output of amplifier 300, such that quality of the output of amplifier 300 may be maintained.

Figure 8:
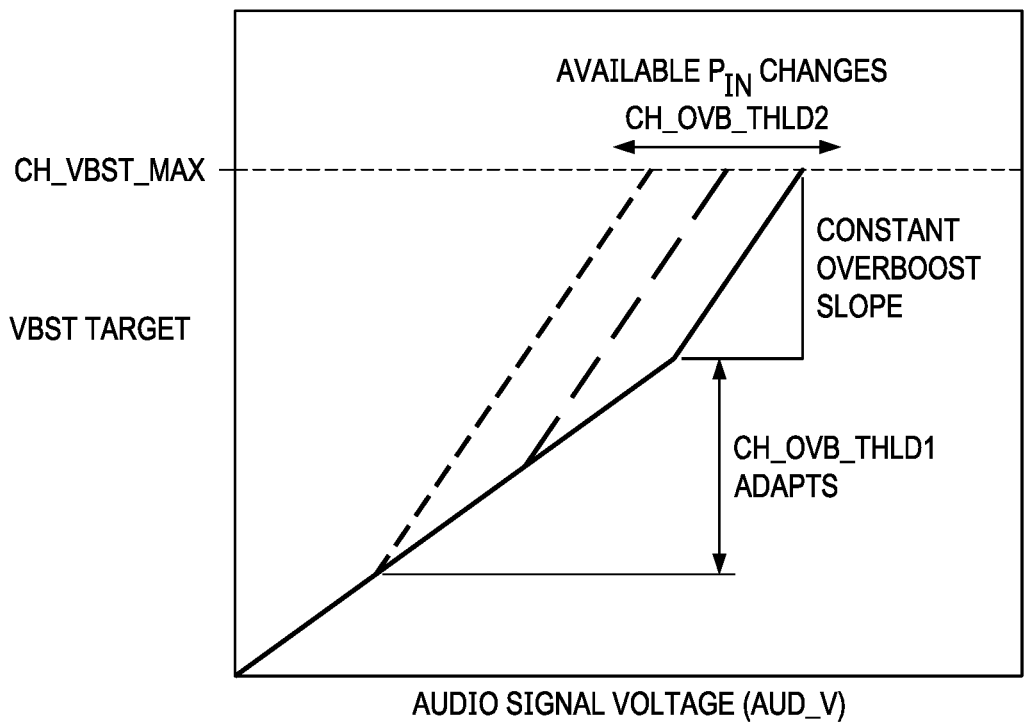
FIG. 8 illustrates a graph depicting adaptation of a first threshold to maintain constant charge slope and maintain a constant slope relationship with a second threshold, in accordance with embodiments of the present disclosure.
Figure 9:
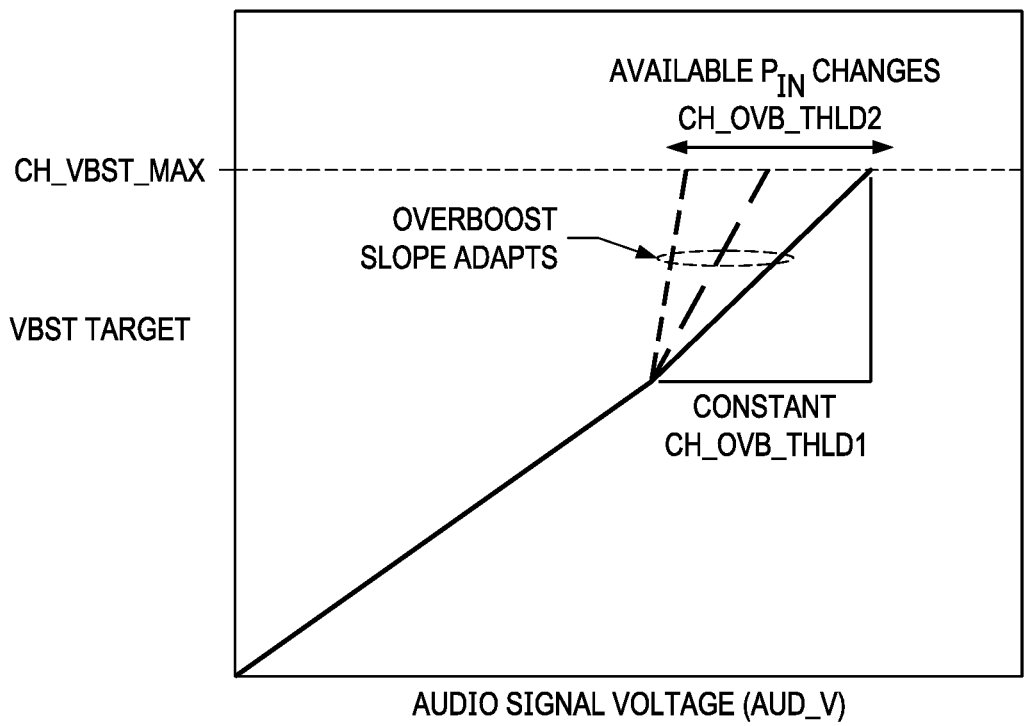
FIG. 9 illustrates a graph depicting adaptation of the second threshold to maintain constant charge slope and maintain a constant slope relationship with the first threshold, in accordance with embodiments of the present disclosure.

FIG. 8 depicts an example of how Class H headroom controller 111 may adapt threshold CH_OVB_THLD1 to maintain a constant charge slope and maintain a constant slope relationship with CH_OVB_THLD2. An over-boost profile which dynamically adapts its thresholds (e.g., threshold CH_OVB_THLD1 and threshold CH_OVB_THLD2) to vary the over-boost slope may be advantageous in systems where maintaining efficiency is of utmost importance and the boosted amplifier system is not expected to reach input current limit BST_ILIM 205 very frequently. For this type of configuration, the use case requirements may dictate that it is desirable to keep the over-boosted range of operation limited to high signals only independent of battery or brownout conditions. Similar to FIG. 8, FIG. 9 depicts an example of how Class H headroom controller 111 may adapt threshold CH_OVB_THLD2 to maintain a constant charge slope and maintain a constant slope relationship with CH_OVB_THLD1.

Turning again to FIG. 2, delays and timers block 112 may allow updates of Class H Headroom Control 111 to be slowed down in order to accommodate limiting the bandwidth of changes to target boosted voltage 130. For example, if it is not desirable to have target boosted voltage 130 immediately track the audio signal downward for purposes of efficiency or if it is desirable to create a more stable boosted supply voltage VBST, a "release timer" may be applied by delays and timers block 112 in order to limit the rate of reduction of stable boosted supply voltage VBST by only allowing the target boosted voltage 130 to be reduced after a period of time, or a repeating period of time for repetitive downward steps. These "release timer" steps may be independently configured to respond differently when in an over-boosted and non-over-boosted state of operation.

Target boosted voltage 130 may be a target voltage for boosted supply voltage VBST that boost converter 210 is requested to generate, and thus, boost converter 210 may generate boosted supply voltage VBST based on requested target boosted voltage 130. In a Class H system, signal-based tracking may always have the ability to update target boosted voltage 130 based on the changing input audio signal, a changing headroom requirement, a delayed releasing voltage target, or a changing battery supply 200.

Input current limit BST_ILIM 205 may define a limit for an input current consumption by boost converter 210 (e.g., battery current IBATT). Such current limit may be a peak current limit or average input current limit. The purpose of input current limit BST_ILIM 205 may be to limit the current consumption of boost converter 210 from the battery supply 200. This limit may be based on hardware safety requirements, the capability of battery supply 200, or dynamically manipulated by the user or a sub-system integrated on the IC for purposes of other power management functionality.

It may be important to provide input current limit BST_ILIM 205 to Class H headroom control 111, as it may allow incoming input signal 400 to be compared against the buffered audio data monitored by Class H signal detector 110 to determine when an increasing input signal 400 may be close to reaching input current limit BST_ILIM 205 and/or to determine the presence of decreasing battery voltage VBATT. If the output power consumption requirements of the buffered signal 115 provided to amplifier 300 are about to exceed the capability of the boost converter 210 when battery current IBATT is limited by input current limit BST_ILIM 205, then the over-boost functionality of Class H headroom controller 111 may take action in order to pre-charge and later provide a temporary energy storage reservoir by way of energy storage device 220 to supplement the power delivery of boost converter 210 to amplifier 300 prior to being limited by input current limit BST_ILIM 205 and putting the output of boost converter 210 into a loss of regulation state.

Boost input current signal 206 may be generated by boost converter 210 and may be representative of battery current IBATT, and such boost input current signal 206 may be used to inform other functional blocks, such as Class H headroom controller 111, of the status of current consumption of battery current IBATT. Class H headroom controller 111 may use boost input current signal 206 in conjunction with input current limit BST_ILIM 205 and/or any applicable user configurations 410 to determine when the boosted amplifier system implemented by audio IC 9 should be operating in an over-boost state or in a non-over-boosted state. As current consumption of battery current IBATT approaches input current limit BST_ILIM 205, the probability of boost converter 210 running out of available input power may increase and the need to build up temporary storage as an additional source of power delivery to amplifier 300 may also increase.

In some embodiments, it may not be necessary to directly measure boost input current signal 206, and it may instead be calculated or estimated by boost converter 210 based on its operational conditions. However, the more accurate boost input current signal 206 is relative to battery current IBATT and input current limit BST_ILIM 205, the more consistent the performance and response of the over-boost functionality may be in determining when it is necessary to generate an over-boosted supply voltage for purposes of temporary energy storage.

ADC 120 may monitor battery voltage 201 in order to account for both input power adjustments and determining when boost converter 210 needs to generate a boosted supply voltage (e.g., VBST>VBATT) versus operating in a non-boosted operation (e.g., VBST=VBATT) in order to meet the headroom requirements of the audio signal. In the event that Class H headroom controller 111 calculates an over-boost threshold using a calculated power input to estimate the available current instead of a direct input current measurement, battery voltage 201 as monitored by ADC 120 monitored value is used in order to back-calculate battery current IBATT.

Battery supply 200 may be considered the main power supply to boost converter 210 and any other circuitry of audio IC 9. While other power supplies may be present in a system comprising audio IC 9, battery supply 200 may be the source of a majority of the power delivery to the boosted amplifier implemented by audio IC 9, specifically the combined boosted amplifier power delivery path. In some embodiments, battery supply 200 may comprise an actual battery. However, in other embodiments, battery supply 200 may include a direct-current power supply (e.g., generated by a power converter). Battery supply 200 may supply battery voltage VBATT which, as discussed above, may be monitored by ADC 120, and Class H headroom controller 111 may monitor battery voltage VBATT and battery supply IBATT in order to determine an input power consumed by boost converter 210. Battery current IBATT may comprise an actual current consumed by the boost converter 210. Such current may be filtered by any capacitance (e.g., capacitance 201) on the electrical network of battery supply 200 and may not necessarily be equivalent to the instantaneous current output by battery supply 200 due to the ability to push and pull current on and off capacitor 201.

Boost converter 210 may comprise a switching converter which may generate boosted supply voltage VBST, which may serve as a power supply input of amplifier 300. Boosted supply voltage VBST must remain at a level larger than the magnitude of the output signal of amplifier 300 so that amplifier 300 does not clip the output signal to load 500. However, the closer boosted supply voltage VBST remains to the signal envelope of the output voltage of amplifier 300, the more efficiently the boosted amplifier system implemented by audio IC 9 may operate.

Amplifier 300 may comprise an output stage signal amplifier that may apply a gain to buffered signal 115 to generate an output signal to load 500. In some embodiments, load 500 may comprise an audio transducer. However, load 500 may be application specific and may comprise a load other than an audio transducer.

Figure 10:
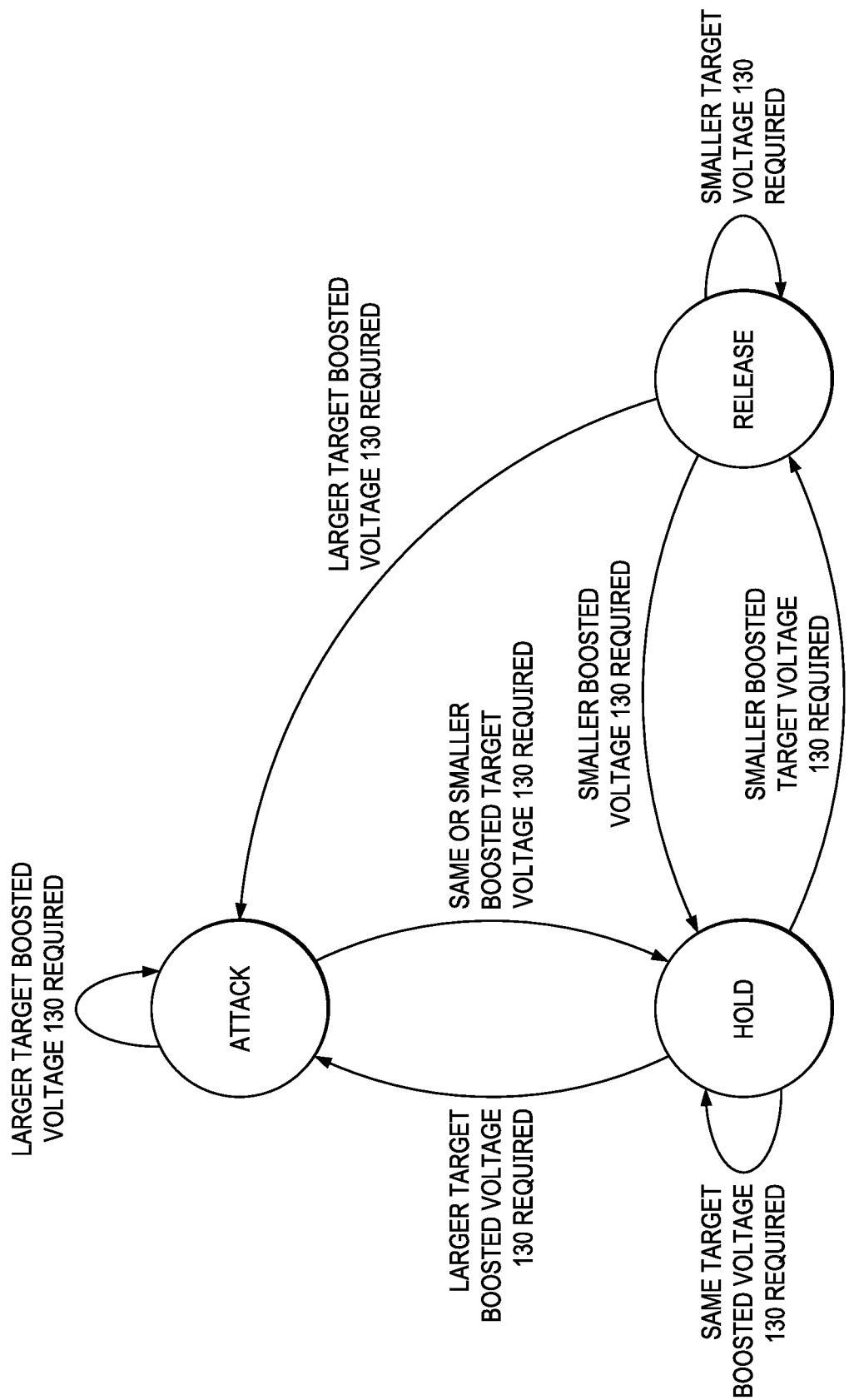
FIG. 10 illustrates an example flow chart of a state machine that may be implemented by a Class H headroom controller, in accordance with embodiments of the present disclosure.

In operation, Class H headroom controller 111 may operate in three primary operational states, as depicted in FIG. 10:

Attack: Input signal 400 and headroom requirements may dictate that target boosted voltage 130 must be increased in order to support the configured operation. Class H headroom controller 111 may cause such increase to occur immediately on its next clock cycle (i.e., as quickly as possible) in order for boosted supply voltage VBST not to clip the output of amplifier 300. The attacking response may generally not be delayed or limited in order to produce a boosted supply voltage VBST which will not clip the signal output to load 500. Any inrush current limiting or voltage increase limiting may be handled at boost converter 210. Class H headroom controller 111 may be intended to request the boosted supply voltage VBST needed for input signal 400, and adjustable memory buffer 102 may provide boost converter 210 adequate time to respond prior to an increasing input signal 400 propagating to amplifier 300.

Hold: Input signal 400 and headroom requirements dictate that target boosted voltage 130 does not need to be increased. Such lack of need to be increased may or may not mean that input signal 400 and headroom requirements determine that boosted supply voltage VBST should remain the same. Accordingly, the hold state may comprise a transitional state between attacks, releases, or a combination thereof. In some embodiments, in order to maintain the response of the system implemented by audio IC 9 consistent, Class H headroom controller 111 may transition through the hold state (even if just briefly).

Release: Input signal 400 and headroom requirements dictate that target boosted voltage 130 may be decreased. A larger time scale slope of a releasing and/or lowering of that target boosted voltage 130 may be dependent on a release rate timer. If the release rate timer is set to zero, the requested reduction in that target boosted voltage 130 may be immediate and may only be limited by a configuration and/or capabilities of boost converter 210.

Figure 11:
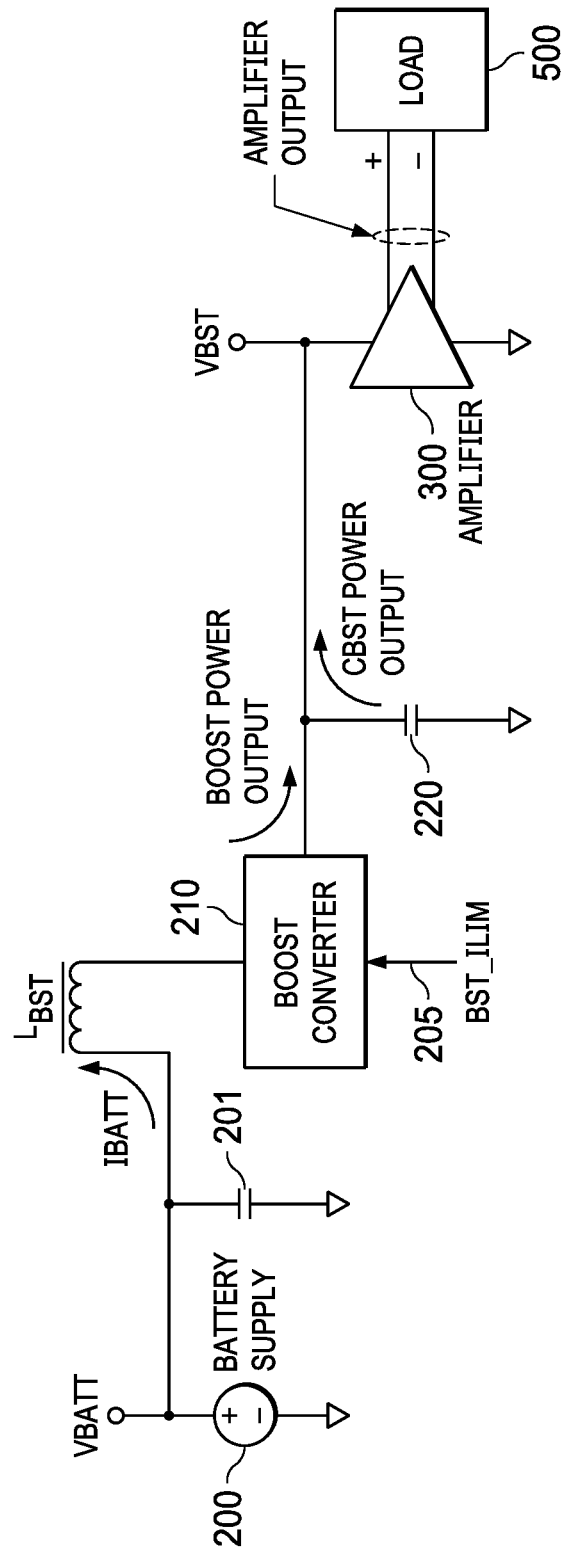
FIG. 11 provides a simplified boosted amplifier circuit reference for the waveforms presented in FIGS. 12-14, in accordance with embodiments of the present disclosure.
Figure 12:
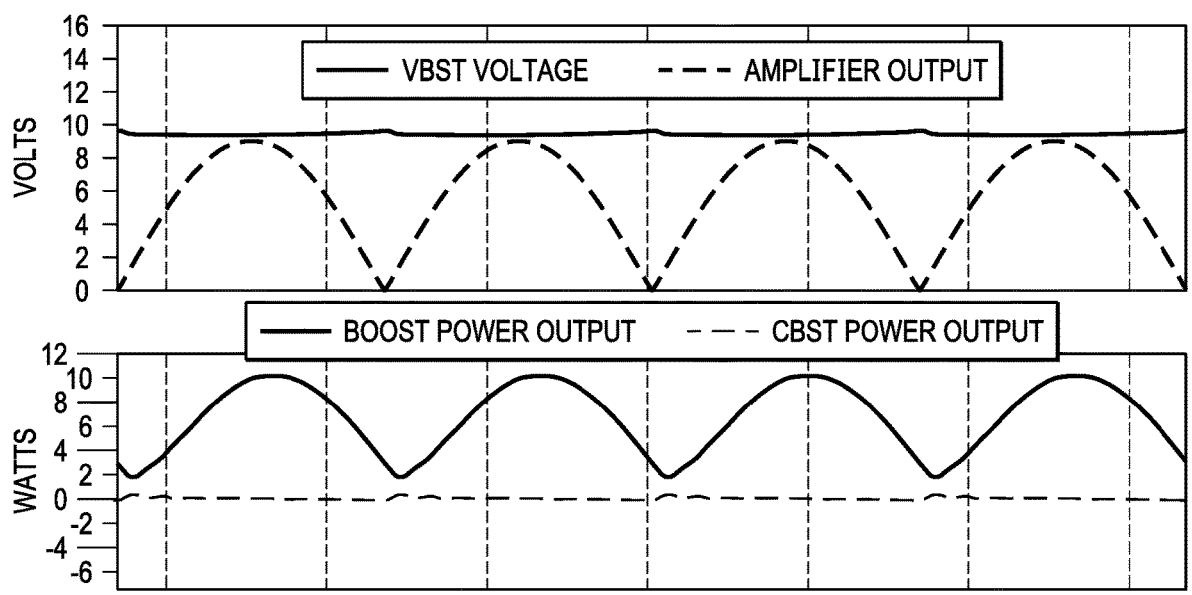
FIG. 12 illustrates a graph depicting Class H tracking of a boosted supply voltage with no input current limit to boost converter, in accordance with embodiments of the present disclosure.
Figure 13:
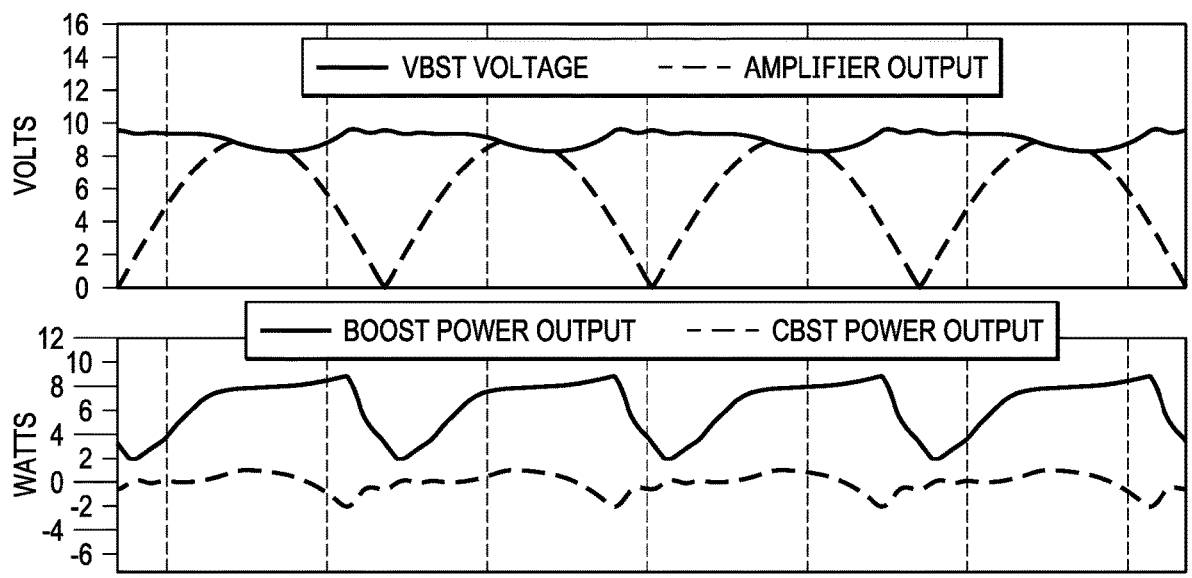
FIG. 13 illustrates a graph depicting Class H tracking of a boosted supply voltage with an input current limit to boost converter, in accordance with embodiments of the present disclosure.
Figure 14:
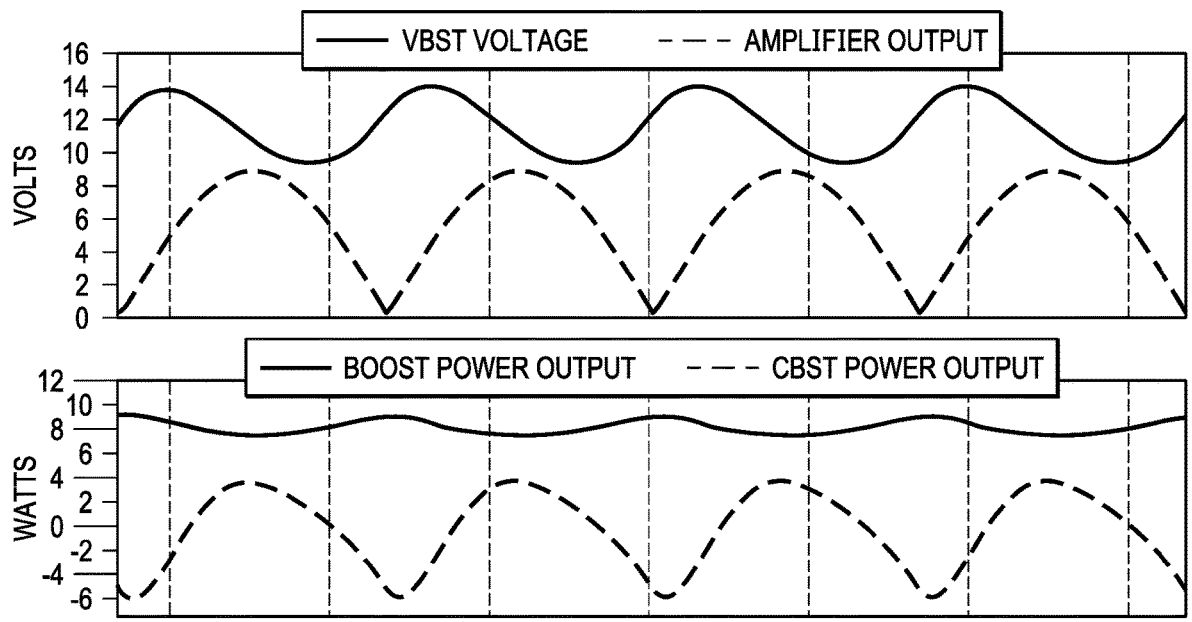
FIG. 14 illustrates a graph depicting Class H tracking of an over-boosted boosted supply voltage with an input current limit to boost converter, in accordance with embodiments of the present disclosure.

FIG. 11 provides a simplified boosted amplifier circuit reference for the waveforms presented in FIGS. 12-14, in accordance with embodiments of the present disclosure.

In a boosted amplifier system (similar to that depicted in FIG. 2, but without an input current limit BST_ILIM 205), boosted voltage supply VBST may not enter a state in which it loses voltage regulation due to an input current limit being enforced. In such a boosted amplifier system, power delivery of the boosted amplifier is only limited by its load regulation capability and external components. The input power may simply track the output power within the physical capabilities of the boosted amplifier system. In this case, maintaining a voltage which is only slightly above the output signal generated by the amplifier may be all that is required in order to prevent the amplifier's output from being clipped by a boosted supply voltage. Such behavior is depicted in FIG. 12, wherein waveforms are indicated as being at electrical nodes shown in FIG. 11. Comparison in FIG. 12 of the boost power output from boost converter 210 and the CBST power output from energy storage device 220 shows that almost all of the baseband power delivered to load 500 may come directly from boost converter 210, and in this non-power limited case, energy storage device 220 may only provide high frequency filtering for the boost converter's output current. Boosted supply voltage VBST may remain in a regulated (and steady) state throughout the change in loading.

The example waveforms of FIGS. 12-14 show Class H tracking as being slowed down to a point where the boosted supply voltage VBST remains constant from a control standpoint (e.g., a long release rate in delays and timers block 112). Such control may be performed in order to focus on how energy storage device 220 charges, discharges, and may provide energy storage with the three system configurations presented for comparison: no input current limit (FIG. 12), input current limit (FIG. 13), and over-boosted with an input current limit (FIG. 14). The example sinusoidal output signal of amplifier 300 is rectified in order to illustrate how loading appears relative to boost converter 210 when providing power to a full-bridge amplifier output stage.

Due to the filtering present in the model used for simulation to calculate the baseband output power (instead of instantaneous switching power), there may exist a slight delay in time between the top and bottom panes in FIGS. 12-14. The modeled examples providing the results in FIGS. 12-14 may use a 3-kHz rectified sine wave as a load and a 5 µF capacitor for energy storage device 220.

FIG. 13 depicts how an audio IC 9 operating without an over-boost, but having a boost converter input current limit (e.g., input current limit BST_ILIM 205), may lose its ability to regulate boosted supply voltage VBST when input current limit BST_ILIM 205 has been reached and no additional IBATT current is able to be consumed. At this point, boost converter 210 no longer increases its input power consumption to support its increasing output power delivery requirements and boosted supply voltage VBST may collapse until the boosted amplifier system reaches equilibrium due to the collapse of boosted supply voltage VBST limiting power delivery. In a boosted amplifier system, such collapse of boosted supply voltage VBST may cause clipping of the output of amplifier 300 and distortion of the signal driven to load 500. Often, boosted amplifier systems have high linearity and low distortion requirements, meaning that such clipping behavior is problematic and may negatively impact the end user experience of the final product.

In portable battery-operated devices, or other end products which have a limited power supply capability, input current limit BST_ILIM 205 may often be configured in order to protect the power source, battery, device hardware, or prevent a brownout condition on the system (e.g., a self-resetting condition due to low voltage operation). Such protection means that limits must be enforced on how much power audio IC 9 is able to consume.

The example of FIG. 13 illustrates that at the peak of output signal of amplifier 300, boosted supply voltage VBST may collapse due to it hitting input current limit BST_ILIM 205 of boost converter 210. When the input current limit BST_ILIM 205 has been reached, the boost power output shown in FIG. 13 becomes limited and no longer tracks the output signal of amplifier 300 as it does in FIG. 12. As shown by the CBST Power Output, some additional energy may be temporarily provided by the energy storage device 220, but such additional energy may not be enough to prevent the boosted supply voltage VBST from collapsing and the output of amplifier 300 from being clipped due to the increasing signal and boosted supply voltage VBST. As the load decreases, energy storage device 220 may be recharged (indicated by negative CBST Power Output) and the boosted supply voltage VBST may recover.

The example of FIG. 14 illustrates if all of the other setup conditions present with FIG. 13 are maintained, but an over-boosted supply voltage VBST is introduced. In the example of FIG. 14, energy storage device 220 may be capable of providing enough energy to load 500 in order to prevent collapse of boosted supply voltage VBST voltage from clipping the output of amplifier 300. Due to the repeating sinusoidal input signal 400, energy storage device 220 may experience a repeating cycle of charging and discharging to provide the extra energy to load 500 when the boost power output is limited due to the restrictions of the input current limit BST_ILIM 205.

Accordingly, Class H headroom controller 111 may be configured to recognize when it is necessary to pre-charge energy storage device 220 and prepare for over-boost during a condition in which boost converter 210 may run out of the ability to provide the output power or voltage required by amplifier 300 due to input current limit BST_ILIM 205 and/or other restrictions. Incorporating over-boost functionality into a Class H amplifier system may have the benefit of maintaining a high level of system efficiency through Class H tracking for a majority of an output range of an amplifier, while still permitting peaks of peak power delivery higher than the boost converter permits by itself. Most amplifiers operate most efficiently when their output voltage is close to the supply voltage.

Conversely, statically generating a higher boosted supply voltage VBST without taking into consideration the requirements of input signal 400 and amplifier 300 may have the disadvantage of the additional power consumption and losses in the boosted amplifier system which may reduce the average system efficiency due to generating and maintaining a supply rail which is higher than necessary for a majority of the operation of amplifier 300 and its load 500. Especially for portable devices which are battery powered, this additional power loss associated with a higher, static boosted supply voltage VBST may be significant and directly impact the amount of operational time between battery charging cycles, as well as the user experience of the end product containing the boosted amplifier.

Typically, a designer of an end system which uses a boosted amplifier may try to achieve as much output power from audio IC 9 as possible. For example, in an audio system, such approach may translate into maximizing auditory loudness for the user of the end system, assuming the end device is an audio device. However, in battery-powered devices, limitations may exist regarding an amount of input power that may be consumed by a boosted amplifier. These limitations may produce the effect of a system designer tuning where the boosted amplifier system is often reaching its input current limit at peaks of the amplified signal in order to maximize loudness. However, due to input current limit BST_ILIM 205, other power restrictions, and/or an insufficient boosted supply voltage, such tuning approach often comes at a cost of an increased distortion due to signal clipping (e.g., increased total harmonic distortion (THD)). Also, care must be taken that this enablement of maximizing power output does not come at the cost of system efficiency, as in a battery-powered device such increased use of power may translate directly into run-time between charges or battery replacement. Using an over-boost function to dynamically produce temporary energy storage by increasing boosted supply voltage VBST as determined by a function of the input power restrictions and output power delivery requirements may significantly reduce boosted amplifier power losses and increase overall system efficiency when compared to operating at a boosted supply voltage VBST.

The amount of stored energy available to amplifier 300 from energy storage device 220 may be based on a difference between boosted supply voltage VBST and output voltage of amplifier 300 (represented by rectified output referred signal AUD_V). Amplifier 300 may be supplied by boosted supply voltage VBST and a magnitude of rectified output referred signal AUD_V may not exceed boosted supply voltage VBST. However, when rectified output referred signal AUD_V is greater than boosted supply voltage VBST, energy storage device 220 may provide additional energy storage which may be utilized without clipping by amplifier 300. Typically, an amplifier requires some voltage headroom above rectified output referred signal AUD_V in order to output rectified output referred signal AUD_V. However, if this relationship is simplified and the assumption is made that amplifier 300 operates at 100% modulation index (e.g., amplifier 300 generates rectified output referred signal AUD_V all the way to the boosted supply voltage VBST), then the available energy storage (ECAP_AVAIL) on energy storage device 220 that may be discharged without clipping the output signal of amplifier 300 due to the decreasing boosted supply voltage VBST may be given by $ECAP\_AVAIL = \frac{1}{2} \ast CBST \ast (VB^2 - VA^2)$, where CBST is a capacitance of energy storage device 220 and the difference VB−VA may be considered the over-boosted voltage. As a function of stored energy, increasing the over-boosted voltage may have a squared effect on the energy storage and is more effective at increasing energy storage than increasing capacitance CBST. Increasing capacitance CBST for purposes of charge storage may tend to add significantly more cost to the product's build of materials than increasing the maximum voltage rating of the components being used in order to support the over-boost.

During normal operation in which input power of boost converter 210 is not limited, voltage on energy storage device 220 may remain constant. However, when input current limit BST_ILIM 205 has been reached and boost converter 210 is not capable of providing more output power, the extra energy stored in energy storage device 220 may be discharged to provide temporary power delivery to amplifier 300 in order to maintain the boosted supply voltage VBST at a level high enough that amplifier 300 does not clip. When the loading of amplifier 300 decreases to a level in which boost converter 210 may no longer be input current limited, energy storage device 220 may then be recharged. The energy in energy storage device 220 may then be replenished for the next time it is required for use, as shown in the example of FIG. 14.

The supplemental energy provided by energy storage device 220 may be temporary, but in the dynamic nature of an audio and/or haptic signal, peak power delivery requirements of a system may also be temporary. How effective this temporary energy storage is in preventing clipping may be based on the power profile of the amplifier loading (i.e., signal content), capacitance CBST, and the over-boosted voltage. For example, a lower frequency bass tone may require more total energy storage than a higher-frequency symbol crash, as the bass frequencies may hold the boost converter at a condition of maximum power delivery for a longer continuous period of time than a higher-frequency signal which has multiple zero-crossings over the same time period. As shown in the example of FIG. 14, each zero crossing or reduction in signal may provide an opportunity for energy storage device 220 to be recharged and used during the next signal peak.

Further, as described above, available energy calculator 113 may determine a total amount of available electrical energy available from battery supply 200 and from the supplemental energy stored on energy storage device 220, determine whether the available electrical energy is sufficient to avoid clipping of the signal output by amplifier 300 and responsive to a determination that the total available electrical energy is insufficient to avoid clipping of the signal output by amplifier 300, modify (e.g., decrease) a gain applied by signal conditioning block 101 and/or amplifier 300 in order to avoid such clipping.

Producing an over-boosted voltage may require knowing in advance that boost converter 210 is about to reach input current limit BST_ILIM 205 and therefore run out of power which may be directly delivered by boost converter 210 to amplifier 300. An over-boosted supply voltage VBST cannot be generated from a non-over-boosted supply voltage VBST when boost converter 210 has already reached input current limit BST_ILIM 205. Creating the increased boosted supply voltage VBST requires boost converter 210 to consume additional input current as a part of increasing the boosted supply voltage VBST on energy storage device 220. If input current limit BST_ILIM 205 has been reached prior to the over-boosted voltage being generated, then no additional output power may be available from boost converter 210 to increase boosted supply voltage VBST.

Additionally, when increasing boosted supply voltage VBST for the purposes of over-boost, boost converter 210 may or may not already be supporting an output load. As discussed previously, an adjustable memory buffer 102 may be used in order to identify what boosted supply voltage VBST needs to be before a signal is gained up and output from amplifier 300 so that boost converter 210 may prepare and generate the appropriate boosted supply voltage VBST before amplifier 300 actually requires it. When adjustable memory buffer 102 is made shorter, there may be less opportunity to make a large change to the system, and the more conservatively the over-boosted Class H system or the over-boost thresholds (e.g., threshold CH_OVB_THLD1) may need to be configured in order to support the generation of the over-boosted supply and still maintain operation within input current limit BST_ILIM 205 as compared to a system in which adjustable memory buffer 102 is longer. In some embodiments, input current limit BST_ILIM 205 must be enforced at all times, as it may defeat the purpose of the current limit to temporarily bypass the current limit in order to charge energy storage device 220 to an over-boosted voltage.

Figure 15:
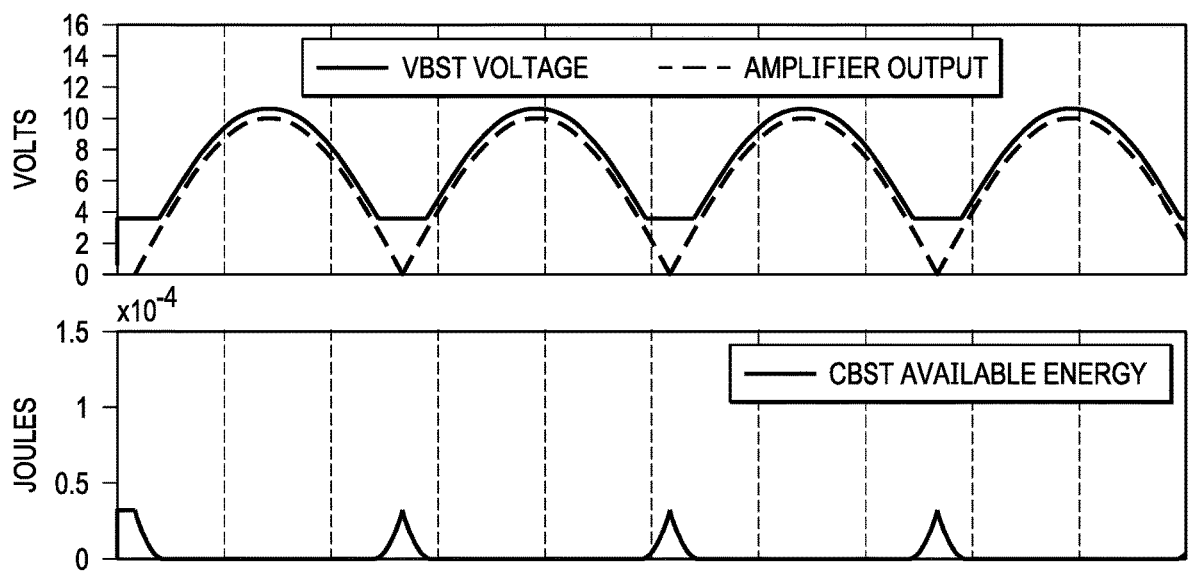
FIG. 15 illustrates a graph depicting example energy storage of an energy storage device with ideal Class H tracking and no over-boost, in accordance with embodiments of the present disclosure.

FIG. 15 illustrates an example of an ideal (i.e., no boost converter limitations or attack/release rates applied) Class H tracking approach that uses a fixed voltage headroom of 0.6 V and no over-boost. In this example, the amount of energy storage available with a 5 uF capacitor for energy storage device 220 at the peak of input signal 400 may be relatively insignificant. The only times in which there may be meaningful energy available on energy storage device is when Class H tracking functionality stops tracking output of amplifier 300 due to it reaching battery voltage VBATT (e.g., 3.8 V), but the output of amplifier 300 continues to decrease to zero. Boost converter 210 cannot generate boosted supply voltage VBST below battery voltage VBATT. The voltage headroom between boosted supply voltage VBST voltage and the output of amplifier 300 may be what enables the temporary energy storage in energy storage device 220.

Figure 16:
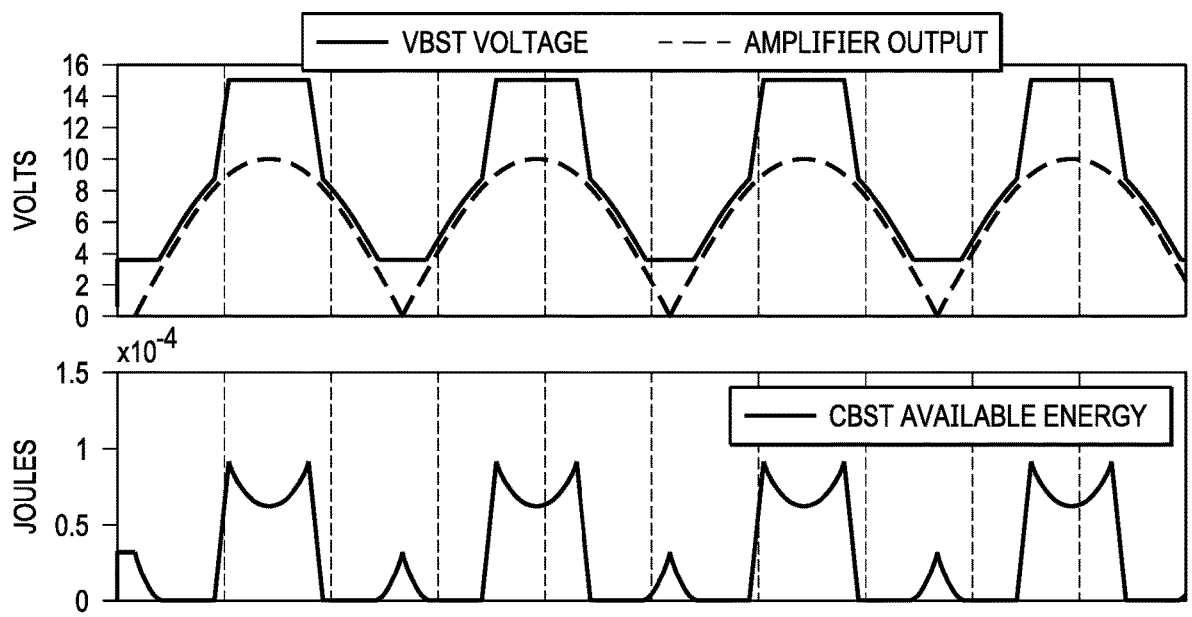
FIG. 16 illustrates a graph depicting example energy storage of an energy storage device with ideal Class H tracking with over-boost at signal peaks, in accordance with embodiments of the present disclosure.
Figure 17:
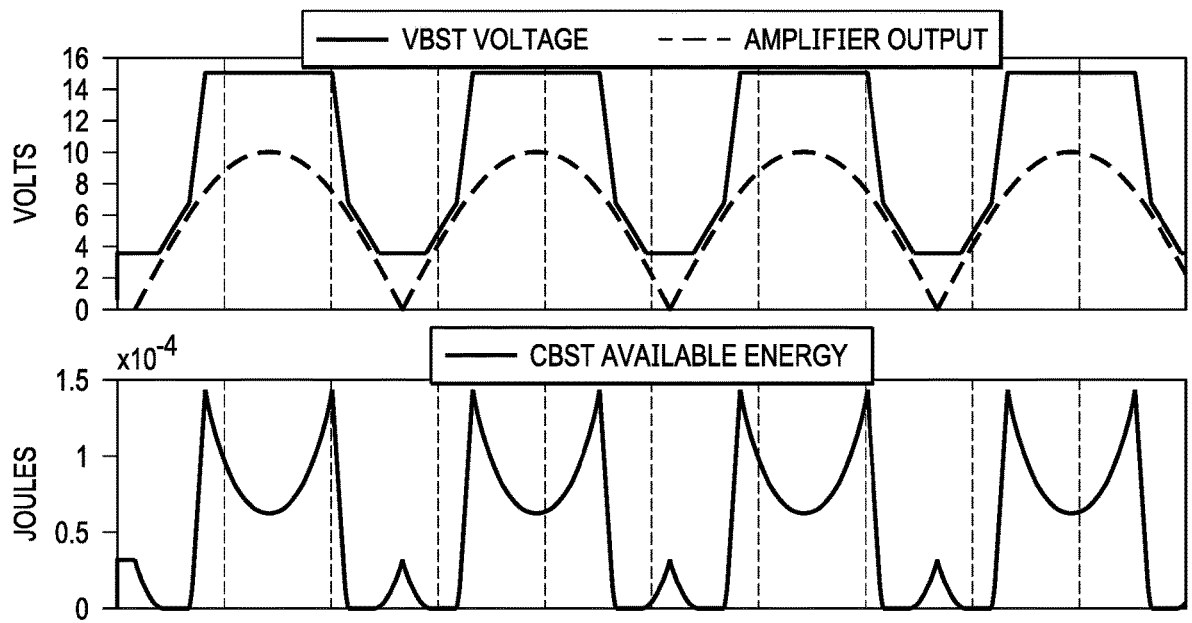
FIG. 17 illustrates a graph depicting example energy storage of an energy storage device with ideal Class H tracking with a broader over-boost than that of FIG. 16, in accordance with embodiments of the present disclosure.

FIGS. 15-17 depict examples showing the potential available energy of energy storage device 220 as a function of the over-boost, and also show how the energy of the output of amplifier 300 may be consumed. No input current limit or power restrictions are present in the examples shown in FIGS. 15-17.

FIG. 16 illustrates a graph depicting example energy storage of an energy storage device with ideal Class H tracking with over-boost at signal peaks, in accordance with embodiments of the present disclosure. As shown in FIG. 16, generating an over-boosted supply around the peak of output of amplifier 300 may allow the system to operate normally for a majority of the operational range of amplifier 300, and to enable additional power output through temporary energy storage when at peak loading conditions. In the example of FIG. 16, at all signal levels below the over-boost thresholds, there is still enough power available through boost converter 210 to supply the required output power of amplifier 300, and it is only at the peaks of the signal at which the additional energy storage may be necessary as a supplement.

FIG. 17 illustrates a graph depicting example energy storage of an energy storage device 220 with ideal Class H tracking with a broader over-boost than that of FIG. 16, in accordance with embodiments of the present disclosure. Such broader over-boost range may be achieved by lowering over-boost thresholds (e.g., threshold CH_OVB_THLD1). Such approach may not increase the amount of available energy at the peak of the output of amplifier 300, where such energy may be most important. When the over-boost has initially ramped up, there may be more available energy storage initially than there is at the peak of output of amplifier 300. This higher energy amount may be due to the output signal of amplifier 300 continuing to increase, but boosted supply voltage remaining constant. If input current limit BST_ILIM 205 is configured so that only the energy storage device 220 needs to be leveraged at the peak, such configuration means that the extra energy of energy storage device 220 may be bled off as the output of amplifier 300 increases. Depending on the bandwidth of boost converter 210, this bleeding of the extra energy may not necessarily have the effect of increasing available energy of energy storage device 220 by the time the peak loading event has occurred. This example also shows how generating an over-boosted voltage 100% of the time may not necessarily be the most effective means of system level optimization for the purposes of providing additional available power for the peak loading conditions. It is the energy available on energy storage device 220 at and around the peak of the output of amplifier 300 which may be most significant.

Notably, the bottom halves of each of FIGS. 16 and 17 depict an amount of available supplemental energy (e.g., ECAP_AVAIL) stored on energy storage device 220. Such information may be used, for example, by available energy calculator 113, to determine if available electrical energy is present to avoid clipping of the signal output by amplifier 300. If such available electrical energy is insufficient (e.g., as may be indicated by the supplemental energy stored on energy storage device 220 reaching zero or a negative amount), available energy calculator 113 may reduce a gain of signal conditioning block 101 and/or amplifier 300 to prevent signal clipping.

As long as boost converter 210 is capable of generating an over-boosted voltage before being limited by input current limit BST_ILIM 205, it may be available for use when input current limit BST_ILIM 205 is reached and boost converter 210 runs out of available output power. However, when temporary energy storage is not enough to prevent amplifier 300 from clipping, a secondary response may be required by the system. Manipulating the audio signal with a system such as the one described in U.S. Pat. No. 10,021,485 entitled "Prevention of Signal Clipping Due to Decrease in Amplifier Supply Voltage" (which is incorporated by reference herein in its entirety) may be used to identify conditions in which the boosted supply voltage VBST and the output signal of amplifier 300 would end up causing the amplifier to clip and, in response, manipulate the signal prior to the clipping occurring. This signal manipulation may have the purpose of reducing the signal and power consumption prior to the boosted supply voltage VBST and the increasing amplifier output, and preventing the clipping from occurring. An amplifier's signal manipulation by itself may prevent the amplifier's output signal from being clipped by boosted supply voltage VBST. However, combining such approach with an over-boost function may reduce the amount of manipulation and the probability of requiring signal manipulation in the first place. As a system, this manipulation reduction may allow more of the original signal content to pass through the amplified system unmodified.

For purposes of illustration throughout this description, "Class H" has been used as a reference to the signal tracking algorithm in conjunction with the disclosed over-boost functionality. However, such reference does not mean that a signal tracking amplitude is limited to Class H architectures. Any signal-tracking method or system which generates a variable supply voltage based on the amplifier's signal amplitude may also be applicable to an over-boosted methodology as described herein.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A power converter comprising:
   an input for receiving an input signal; and
   an output for generating an intermediate signal that is a power converted signal from the input signal wherein the intermediate signal is determined based on various parameters of a signal path that utilizes the intermediate signal, wherein the various parameters comprise one or more of the following: a peak output signal of the signal path, energy requested over a period of time by the signal path, and available energy from an energy source to the power converter.

2. The power converter of claim 1, wherein the power converter is a boost converter.

3. The power converter of claim 1, wherein the intermediate signal varies with respect to an amount of stored energy required by an output of the signal path and available energy from a power supply for providing electrical energy at the input.

4. The power converter of claim 1, further comprising control circuitry configured to determine if a total available energy comprising the available energy from the energy source to the power converter and the stored energy at the output of the power converter is sufficient to prevent signal clipping within the signal path.

5. The power converter of claim 4, wherein the control circuitry is further configured to, if the total available energy is insufficient to prevent signal clipping within the signal path, reduce a signal gain of the signal path.

6. A power converter comprising:
   an input for receiving an input signal; and
   an output for generating an intermediate signal that is a power converted signal from the input signal wherein the intermediate signal varies with respect to an amount of stored energy required by an output of a signal path that utilizes the intermediate signal and available energy from a power supply for providing electrical energy at the input.

7. The power converter of claim 6, wherein the power converter is a boost converter.

8. The power converter of claim 6, further comprising control circuitry configured to determine if a total available energy comprising the available energy from the power supply and a stored energy at the output of the power converter is sufficient to prevent signal clipping within the signal path.

9. The power converter of claim 8, wherein the control circuitry is further configured to, if the total available energy is insufficient to prevent signal clipping within the signal path, reduce a signal gain of the signal path.

10. A system comprising:
    an amplifier configured to amplify an input signal to generate an output signal at an output of the amplifier; and
    a power converter coupled to the amplifier and configured to provide a supply voltage to the amplifier, wherein the power converter is further configured to vary an amount of excess energy stored at an output of the power converter.

11. The system of claim 10, wherein the power converter is configured to modify the amount of excess energy based on the amount of excess energy, an amount of energy the power converter is capable of generating, and an amount of energy required by a signal path comprising the amplifier.

12. The system of claim 11, wherein the amount of energy the power converter is capable of generating is limited by an input current limit the power converter is permitted to draw from a source of electrical energy to the power converter.

13. The system of claim 12, further comprising control circuitry configured to determine if a total available energy comprising an available energy from an energy source to the power converter and the excess energy stored at an output of the power converter is sufficient to prevent signal clipping in the output signal.

14. The system of claim 13, wherein the control circuitry is further configured to, if the total available energy is insufficient to prevent signal clipping in the output signal, reduce a signal gain of the amplifier.

15. A method comprising:
    receiving an input signal; and
    generating with a power converter an intermediate signal that is a power converted signal from the input signal wherein the intermediate signal is determined based on various parameters of a signal path that utilizes the intermediate signal, wherein the various parameters comprise one or more of the following: a peak output signal of the signal path, energy requested over a period of time by the signal path, and available energy from an energy source to the power converter.

16. The method of claim 15, wherein the power converter is a boost converter.

17. The method of claim 15, wherein the intermediate signal varies with respect to an amount of stored energy required by an output of the signal path and available energy from a power supply for providing electrical energy at the input.

18. The method of claim 15, further comprising determining if a total available energy comprising the available energy from the energy source to the power converter and the stored energy at the output of the power converter is sufficient to prevent signal clipping within the signal path.

19. The method of claim 18, further comprising reducing a signal gain of the signal path if the total available energy is insufficient to prevent signal clipping within the signal path.

20. A method comprising:
receiving an input signal at an input; and
generating with a power converter an intermediate signal that is a power converted signal from the input signal wherein the intermediate signal varies with respect to an amount of stored energy required by an output of a signal path that utilizes the intermediate signal and available energy from a power supply for providing electrical energy at the input.

21. The method of claim 20, wherein the power converter is a boost converter.

22. The method of claim 20, further comprising determining if a total available energy comprising the available energy from the power supply and a stored energy at the output of the power converter is sufficient to prevent signal clipping within the signal path.

23. The method of claim 22, further comprising reducing a signal gain of the signal path if the total available energy is insufficient to prevent signal clipping within the signal path.

24. A method comprising:
amplifying an input signal with an amplifier to generate an output signal at an output of the amplifier;
providing, with a power converter coupled to the amplifier, a supply voltage to the amplifier; and
varying with the power converter an amount of excess energy stored at an output of the power converter.

25. The method of claim 24, further comprising modifying the amount of excess energy based on the amount of excess energy, an amount of energy the power converter is capable of generating, and an amount of energy required by a signal path comprising the amplifier.

26. The method of claim 25, further comprising limiting the amount of energy the power converter is capable of generating by an input current limit the power converter is permitted to draw from a source of electrical energy to the power converter.

27. The method of claim 26, further comprising determining if a total available energy comprising an available energy from an energy source to the power converter and the excess energy stored at an output of the power converter is sufficient to prevent signal clipping in the output signal.

28. The method of claim 27, further comprising reducing a signal gain of the amplifier, if the total available energy is insufficient to prevent signal clipping in the output signal.

* * * * *